(12) United States Patent  
Bark et al.

(10) Patent No.: US 11,764,149 B2  
(45) Date of Patent: Sep. 19, 2023

(54) SEMICONDUCTOR DEVICE

(71) Applicant: Samsung Electronics Co., Ltd., Suwon-si (KR)

(72) Inventors: Suhyun Bark, Suwon-si (KR); Kyeongbeom Park, Hwaseong-si (KR); Jongmin Baek, Seoul (KR); Jangho Lee, Hwaseong-si (KR); Wookyung You, Hwaseong-si (KR); Deokyoung Jung, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/866,782

(22) Filed: Jul. 18, 2022

(65) Prior Publication Data

US 2022/0359379 A1 Nov. 10, 2022

Related U.S. Application Data

(63) Continuation of application No. 17/130,293, filed on Dec. 22, 2020, now Pat. No. 11,424,182.

(30) Foreign Application Priority Data

May 7, 2020 (KR) .......... 10-2020-0054420

(51) Int. Cl.
*H01L 21/00* (2006.01)
*H01L 23/522* (2006.01)
(Continued)

(52) U.S. Cl.
CPC ........ *H01L 23/5226* (2013.01); *H01L 23/528* (2013.01); *H01L 27/088* (2013.01)

(58) Field of Classification Search
CPC .. H01L 23/5226; H01L 23/528; H01L 27/088
See application file for complete search history.

(56) References Cited

U.S. PATENT DOCUMENTS 6,245,690 B1 * 6/2001 Yau .................. H01L 21/02271  
438/790  
6,440,838 B1 * 8/2002 Lui ..................... H01L 21/7681  
438/618

(Continued)

FOREIGN PATENT DOCUMENTS

CN 205582908 U * 9/2016 ......... H01L 21/7624  
CN 205582908 U 9/2016  
(Continued)

*Primary Examiner* — Laura M Menz  
(74) *Attorney, Agent, or Firm* — Myers Bigel, P.A.

(57) ABSTRACT

A semiconductor device includes transistors on a substrate, a first interlayer insulating layer on the transistors, a lower interconnection line in an upper portion of the first interlayer insulating layer, an etch stop layer on the first interlayer insulating layer and the lower interconnection line, a second interlayer insulating layer on the etch stop layer, an upper interconnection line in the second interlayer insulating layer, the upper interconnection line including a via portion penetrating the etch stop layer to contact the lower interconnection line, and an etch stop pattern on the etch stop layer and in contact with a first sidewall of the via portion. The second interlayer insulating layer extends on the etch stop pattern and a top surface of the etch stop layer free of the etch stop pattern. A dielectric constant of the etch stop pattern is higher than a dielectric constant of the etch stop layer.

20 Claims, 38 Drawing Sheets

(51) Int. Cl.
*H01L 23/528* (2006.01)
*H01L 27/088* (2006.01)

(56) References Cited

U.S. PATENT DOCUMENTS

| | | | | |
|---|---|---|---|---|
| 6,525,428 | B1 * | 2/2003 | Ngo | H01L 21/76807 |
| | | | | 257/E23.161 |
| 6,534,813 | B1 * | 3/2003 | Park | H01L 21/76897 |
| | | | | 257/E21.507 |
| 6,720,269 | B2 * | 4/2004 | Park | H01L 21/76895 |
| | | | | 257/E21.507 |
| 7,382,055 | B2 * | 6/2008 | Coker | H01L 27/016 |
| | | | | 257/774 |
| 7,863,196 | B2 * | 1/2011 | Chang | H01L 21/76834 |
| | | | | 257/E21.311 |
| 8,178,439 | B2 * | 5/2012 | Tohnoe | H01L 21/76849 |
| | | | | 438/692 |
| 8,395,206 | B2 * | 3/2013 | Lee | H10B 41/27 |
| | | | | 257/324 |
| 8,466,055 | B2 * | 6/2013 | Usami | H01L 21/76834 |
| | | | | 257/E21.546 |
| 9,087,723 | B2 * | 7/2015 | Lee | H01L 21/02255 |
| 9,536,964 | B2 * | 1/2017 | Shiao | H01L 21/76816 |
| 9,553,017 | B2 | 1/2017 | Zhang | |
| 9,859,432 | B2 * | 1/2018 | Ko | H01L 29/66545 |
| 10,079,305 | B2 * | 9/2018 | Lee | H01L 29/66636 |
| 10,361,310 | B2 * | 7/2019 | Ha | H01L 29/785 |
| 10,475,739 | B2 * | 11/2019 | You | H01L 23/53295 |
| 10,514,598 | B2 * | 12/2019 | Marks | C23C 18/145 |
| 10,804,403 | B2 * | 10/2020 | Ha | H01L 29/7851 |
| 10,903,236 | B2 * | 1/2021 | Choi | H10B 43/40 |
| 11,127,789 | B2 * | 9/2021 | Cho | H01L 23/5283 |
| 11,404,434 | B2 * | 8/2022 | Sim | H10B 41/27 |
| 11,424,182 | B2 * | 8/2022 | Bark | H01L 23/5226 |
| 11,508,718 | B2 * | 11/2022 | Kim | H01L 21/823431 |
| 2003/0134521 | A1 * | 7/2003 | Guo | H01L 21/31116 |
| | | | | 257/E21.252 |
| 2004/0155342 | A1 * | 8/2004 | Usami | H01L 21/76834 |
| | | | | 257/E23.161 |
| 2015/0162239 | A1 * | 6/2015 | Nguyen | H01L 21/31111 |
| | | | | 438/702 |
| 2016/0111325 | A1 * | 4/2016 | JangJian | H01L 21/76802 |
| | | | | 257/774 |
| 2016/0372413 | A1 * | 12/2016 | Mahalingam | H01L 21/76832 |
| 2017/0092580 | A1 * | 3/2017 | Huang | H01L 21/7684 |
| 2017/0278742 | A1 * | 9/2017 | Chen | H01L 21/76814 |
| 2019/0043803 | A1 * | 2/2019 | You | H01L 23/53295 |
| 2019/0164758 | A1 | 5/2019 | Su et al. | |
| 2019/0304903 | A1 * | 10/2019 | You | H01L 21/76804 |
| 2019/0333807 | A1 * | 10/2019 | Tung | H01L 23/53266 |
| 2020/0006228 | A1 * | 1/2020 | Yang | H01L 21/76832 |
| 2021/0005551 | A1 * | 1/2021 | Lee | H01L 21/76843 |
| 2021/0020497 | A1 * | 1/2021 | Kang | H01L 23/53295 |
| 2021/0091000 | A1 * | 3/2021 | Peng | H01L 23/5226 |
| 2021/0351123 | A1 * | 11/2021 | Bark | H01L 23/5226 |
| 2022/0068805 | A1 * | 3/2022 | Lee | H01L 29/7827 |
| 2022/0102192 | A1 * | 3/2022 | Su | H01L 21/76895 |
| 2022/0359379 | A1 * | 11/2022 | Bark | H01L 21/76832 |
| 2022/0415123 | A1 * | 12/2022 | Shigeta | A63F 1/18 |
| 2023/0022545 | A1 * | 1/2023 | Lee | H01L 21/76832 |
| 2023/0064127 | A1 * | 3/2023 | Lee | H01L 23/485 |

FOREIGN PATENT DOCUMENTS

| | | | | | |
|---|---|---|---|---|---|
| CN | 109390273 | A | | 2/2019 | |
| CN | 109390273 | A | * | 2/2019 | H01L 21/768 |
| CN | 112242377 | A | | 1/2021 | |
| CN | 112242377 | A | * | 1/2021 | H01L 21/02172 |
| CN | 113629037 | A | * | 11/2021 | H01L 23/5226 |
| CN | 113629037 | A | | 11/2021 | |
| CN | 114121934 | A | | 3/2022 | |
| CN | 114121934 | A | * | 3/2022 | H01L 23/5226 |
| CN | 114649263 | A | * | 6/2022 | H01L 23/5226 |
| DE | 102020113628 | A1 | * | 11/2021 | H01L 21/02074 |
| DE | 102020113628 | A1 | | 11/2021 | |
| JP | 2002299442 | A | | 10/2002 | |
| TW | 202143487 | A | * | 11/2021 | H01L 23/5226 |
| TW | 202143487 | A | | 11/2021 | |
| TW | 202209492 | A | * | 3/2022 | H01L 23/5226 |
| WO | 2019190453 | A1 | | 10/2019 | |

* cited by examiner

SEMICONDUCTOR DEVICE

CROSS-REFERENCE TO RELATED APPLICATION

This U.S. non-provisional patent application is a continuation of and claims priority to U.S. application Ser. No. 17/130,293, filed on Dec. 22, 2020, which claims priority under 35 U.S.C. § 119 to Korean Patent Application No. 10-2020-0054420, filed on May 7, 2020, in the Korean Intellectual Property Office, the disclosures of which are hereby incorporated by reference in their entireties.

Embodiments of the inventive concepts relate to a semiconductor device and, more particularly, to a semiconductor device including a field effect transistor and a method of manufacturing the same.

BACKGROUND

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming semiconductor devices which have excellent performance while overcoming limitations introduced by the high integration have been studied.

SUMMARY

Embodiments of the inventive concepts may provide a semiconductor device capable of improved electrical characteristics and reliability.

In an aspect, a semiconductor device may include a transistor on a substrate, a first interlayer insulating layer on the transistor, a lower interconnection line in an upper portion of the first interlayer insulating layer, an etch stop layer on the first interlayer insulating layer and the lower interconnection line, a second interlayer insulating layer on the etch stop layer, an upper interconnection line in the second interlayer insulating layer, the upper interconnection line including a via portion penetrating the etch stop layer to contact the lower interconnection line, and an etch stop pattern on the etch stop layer and in contact with a first sidewall of the via portion. The second interlayer insulating layer may extend on the etch stop pattern and a top surface of the etch stop layer that is free of the etch stop pattern. The etch stop layer may include a surface treatment region having the etch stop pattern thereon. A concentration of carbon in the surface treatment region may be lower than a concentration of carbon in another region of the etch stop layer, which is different than the surface treatment region.

In an aspect, a semiconductor device may include a transistor on a substrate, a first interlayer insulating layer on the transistor, a lower interconnection line in an upper portion of the first interlayer insulating layer, an etch stop layer on the first interlayer insulating layer and the lower interconnection line, a second interlayer insulating layer on the etch stop layer, an upper interconnection line in the second interlayer insulating layer, the upper interconnection line including a via portion penetrating the etch stop layer to contact the lower interconnection line, and an etch stop pattern on the etch stop layer and in contact with opposing sidewalls of the via portion. The via portion in contact with the etch stop pattern may have a first width in a first direction, and a maximum width of the etch stop pattern in the first direction may be a second width. The second width may range from about 1.2 times to about 3 times the first width.

In an aspect, a semiconductor device may include a substrate including an active region, a device isolation layer defining active patterns on the active region, wherein the device isolation layer covers a sidewall of a lower portion of each of the active patterns and an upper portion of each of the active patterns protrudes from the device isolation layer, source/drain patterns and a channel pattern therebetween in the upper portion of each of the active patterns, a gate electrode intersecting the channel pattern and extending in a first direction, gate spacers on opposing sidewalls of the gate electrode and extending along the gate electrode in the first direction, a gate dielectric pattern between the gate electrode and the channel pattern and between the gate electrode and the gate spacers, a gate capping pattern on a top surface of the gate electrode and extending along the gate electrode in the first direction, a first interlayer insulating layer on the gate capping pattern, an active contact penetrating the first interlayer insulating layer and electrically connected to at least one of the source/drain patterns, a first metal layer in a second interlayer insulating layer that is on the first interlayer insulating layer, a second metal layer in a third interlayer insulating layer that is on the second interlayer insulating layer, an etch stop layer between the second interlayer insulating layer and the third interlayer insulating layer, and an etch stop pattern on the etch stop layer. The first metal layer may include a lower interconnection line extending in a second direction intersecting the first direction, and the lower interconnection line may be electrically connected to the active contact. The second metal layer may include an upper interconnection line electrically connected to the lower interconnection line. The upper interconnection line may include a via portion penetrating the etch stop layer to contact the lower interconnection line. The etch stop pattern may be in contact with a first sidewall of the via portion. The third interlayer insulating layer may cover the etch stop pattern and a top surface of the etch stop layer that is free of the etch stop pattern. A first dielectric constant of the etch stop pattern may be higher than a second dielectric constant of the etch stop layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
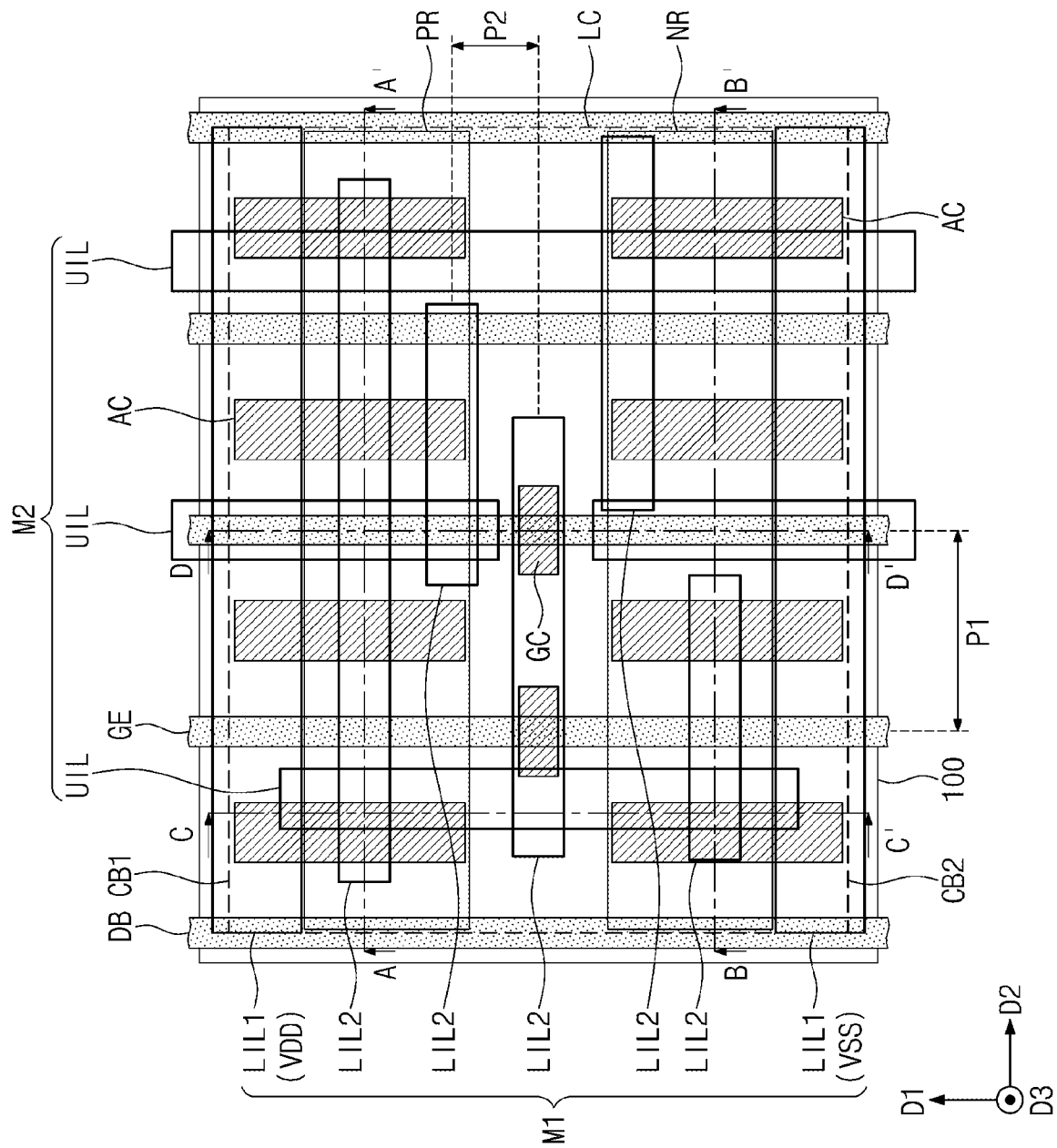
FIG. 1 is a plan view illustrating a semiconductor device according to some embodiments of the inventive concepts.

FIG. 1 is a plan view illustrating a semiconductor device according to some embodiments of the inventive concepts. FIGS. 2A, 2B, 2C and 2D are cross-sectional views taken along lines A-A', B-B', C-C' and D-D' of FIG. 1, respectively. FIG. 3 is an enlarged cross-sectional view of a region 'M' of FIG. 2D.

Referring to FIGS. 1 and 2A to 2D, a logic cell LC may be provided on a substrate 100. In the present specification, the logic cell LC may refer to or otherwise include a logic element (e.g., an inverter, a flip-flop, etc.) for performing a specific function. In other words, the logic cell LC may include transistors and interconnection lines connecting the transistors to each other, which constitute the logic element.

The substrate 100 may include a first active region PR and a second active region NR. The terms "first," "second," etc. may be used herein merely to distinguish one element, region, layer, characteristic, etc. from another. When elements, layers, or regions are referred to as being directly on one another, no intervening elements, layers, or regions are present. In some embodiments, the first active region PR may be a PMOSFET region, and the second active region NR may be an NMOSFET region. The substrate 100 may be a semiconductor substrate including silicon, germanium, or silicon-germanium or may be a compound semiconductor substrate. In some embodiments, the substrate 100 may be a silicon substrate.

The first active region PR and the second active region NR may be defined by a second trench TR2 formed in an upper portion of the substrate 100. The second trench TR2 may be disposed between the first active region PR and the second active region NR. The first active region PR and the second active region NR may be spaced apart from each other in a first direction D1 with the second trench TR2 interposed therebetween. Each of the first and second active regions PR and NR may extend in a second direction D2 intersecting the first direction D1.

First active patterns AP1 may be provided on the first active region PR, and second active patterns AP2 may be provided on the second active region NR. The first and second active patterns AP1 and AP2 may extend in parallel to each other in the second direction D2. The first and second active patterns AP1 and AP2 may be portions of the substrate 100, which protrude in a vertical direction (i.e., a third direction D3). First trenches TR1 may be defined between the first active patterns AP1 adjacent to each other and between the second active patterns AP2 adjacent to each other. The first trench TR1 may be shallower than the second trench TR2.

A device isolation layer ST may fill the first and second trenches TR1 and TR2. The device isolation layer ST may include a silicon oxide layer. Upper portions of the first and second active patterns AP1 and AP2 may vertically protrude upward from the device isolation layer ST (see FIG. 2D). Each of the upper portions of the first and second active patterns AP1 and AP2 may have a fin shape. The device isolation layer ST may not cover the upper portions of the first and second active patterns AP1 and AP2. The device isolation layer ST may cover sidewalls of lower portions of the first and second active patterns AP1 and AP2.

First source/drain patterns SD1 may be provided in the upper portions of the first active patterns AP1. The first source/drain patterns SD1 may be dopant regions having a first conductivity type (e.g., a P-type). A first channel pattern CH1 may be disposed between a pair of the first source/drain patterns SD1. Second source/drain patterns SD2 may be provided in the upper portions of the second active patterns AP2. The second source/drain patterns SD2 may be dopant regions having a second conductivity type (e.g., an N-type). A second channel pattern CH2 may be disposed between a pair of the second source/drain patterns SD2.

The first and second source/drain patterns SD1 and SD2 may include epitaxial patterns formed by a selective epitaxial growth (SEG) process. In some examples, top surfaces of the first and second source/drain patterns SD1 and SD2 may be coplanar with top surfaces of the first and second channel patterns CH1 and CH2. In other examples, the top surfaces of the first and second source/drain patterns SD1 and SD2 may be higher than the top surfaces of the first and second channel patterns CH1 and CH2 relative to the substrate 100.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel patterns CH1. For example, the second source/drain patterns SD2 may include the same semiconductor element (e.g., silicon) as the substrate 100.

Gate electrodes GE may extend in the first direction D1 to intersect the first and second active patterns AP1 and AP2. The gate electrodes GE may be arranged at a first pitch P1 in the second direction D2. The gate electrodes GE may vertically overlap with the first and second channel patterns CH1 and CH2. Each of the gate electrodes GE may surround a top surface and both (e.g., opposing) sidewalls of each of the first and second channel patterns CH1 and CH2.

Referring again to FIG. 2D, the gate electrode GE may be provided on a first top surface TS1 of the first channel pattern CH1 and at least one first sidewall S1 of the first channel pattern CH1. The gate electrode GE may be provided on a second top surface TS2 of the second channel pattern CH2 and at least one second sidewall S2 of the second channel pattern CH2. In other words, transistors according to the present embodiments may be three-dimensional (3D) field effect transistors (e.g., FinFETs) in which the gate electrode GE three-dimensionally surrounds channels CH1 and CH2.

Referring again to FIGS. 1 and 2A to 2D, a pair of gate spacers GS may be disposed on both (e.g., opposing) sidewalls of each of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110 to be described later. The gate spacers GS may include at least one of SiCN, SiCON, or SiN. In certain embodiments, each of the gate spacers GS may have a multi-layered structure formed of at least two of SiCN, SiCON, or SiN.

A gate capping pattern GP may be provided on each of the gate electrodes GE. The gate capping pattern GP may extend along the gate electrode GE in the first direction D1. The gate capping pattern GP may include a material having an etch selectivity with respect to first and second interlayer insulating layers 110 and 120 to be described later. For example, the gate capping patterns GP may include at least one of SiON, SiCN, SiCON, or SiN.

A gate dielectric pattern GI may be disposed between the gate electrode GE and the first active pattern AP1 and between the gate electrode GE and the second active pattern AP2. The gate dielectric pattern GI may extend along a bottom surface of the gate electrode GE thereon. For example, the gate dielectric pattern GI may cover the first top surface TS1 and the first sidewalls S1 of the first channel pattern CH1. The gate dielectric pattern GI may cover the second top surface TS2 and the second sidewalls S2 of the second channel pattern CH2. The gate dielectric pattern GI may cover a top surface of the device isolation layer ST under the gate electrode GE (see FIG. 2D).

In some embodiments, the gate dielectric pattern GI may include a high-k dielectric material of which a dielectric constant is higher than that of silicon oxide. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The gate electrode GE may include a first metal and a second metal on the first metal. The first metal may be provided on the gate dielectric pattern GI and may be adjacent to the first and second channel patterns CH1 and CH2. The first metal may include a work function metal for adjusting a threshold voltage of the transistor. A desired threshold voltage may be obtained by adjusting a thickness and a composition of the first metal.

The first metal may include a metal nitride. For example, the first metal may include nitrogen (N) and at least one metal selected from titanium (Ti), tantalum (Ta), aluminum (Al), tungsten (W), or molybdenum (Mo). The first metal may further include carbon (C). In some embodiments, the first metal may include a plurality of stacked work function metal layers.

The second metal may include a metal having a resistance lower than that of the first metal. For example, the second metal may include at least one metal selected from f tungsten (W), aluminum (Al), titanium (Ti), or tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. A second interlayer insulating layer 120 may be provided on the first interlayer insulating layer 110 and the gate capping patterns GP. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include a silicon oxide layer.

A pair of isolation structures DB may be respectively provided at both sides of the logic cell LC, which are opposite to each other in the second direction D2. The isolation structure DB may extend in the first direction D1 in parallel to the gate electrodes GE. A pitch between the isolation structure DB and the gate electrode GE adjacent thereto may be equal to the first pitch P1.

The isolation structure DB may penetrate the first and second interlayer insulating layers 110 and 120 and may extend into the first and second active patterns AP1 and AP2. The isolation structure DB may penetrate the upper portions of the first and second active patterns AP1 and AP2. The isolation structure DB may isolate the first and second active regions PR and NR of the logic cell LC from an active region of an adjacent logic cell.

Active contacts AC may penetrate the second and first interlayer insulating layers 120 and 110 so as to be electrically connected to the first and second source/drain patterns SD1 and SD2. Each of the active contacts AC may be provided between a pair of the gate electrodes GE.

The active contact AC may be a self-aligned contact. In other words, the active contact AC may be formed to be self-aligned using the gate capping pattern GP and the gate spacer GS. For example, the active contact AC may cover at least a portion of a sidewall of the gate spacer GS. Even though not shown in the drawings, the active contact AC may cover a portion of the top surface of the gate capping pattern GP.

Silicide patterns SC may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or cobalt silicide.

A gate contact GC may penetrate the second interlayer insulating layer 120 and the gate capping pattern GP so as to contact and be electrically connected to the gate electrode GE. The gate contact GC may be provided between the first and second active regions PR and NR when viewed in a plan view. A bottom surface of the gate contact GC may be in contact with the top surface of the gate electrode GE. A top surface of the gate contact GC may be coplanar with a top surface of the second interlayer insulating layer 120.

Each of the active contact AC and the gate contact GC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover a bottom surface and sidewalls of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be provided in the third interlayer insulating layer 130. The first metal layer M1 may include first lower interconnection lines LIL1, second lower interconnection lines LIL2, and lower vias VI. The lower vias VI may be provided under the first and second lower interconnection lines LIL1 and LIL2.

The first lower interconnection lines LIL1 may intersect the logic cell LC and may extend in the second direction D2. The first lower interconnection lines LIL1 may be power/source interconnection lines. For example, a drain voltage VDD or a source voltage VSS may be applied to the first lower interconnection line LIL1.

Referring to FIG. 1, a first cell boundary CB1 extending in the second direction D2 may be defined at a side of the logic cell LC. A second cell boundary CB2 extending in the second direction D2 may be defined at another side of the logic cell LC, which is opposite to the first cell boundary CB1. The first lower interconnection line LIL1 to which the drain voltage VDD (i.e., a power voltage) is applied may be disposed on the first cell boundary CB1. The first lower interconnection line LIL1 to which the drain voltage VDD is applied may extend along the first cell boundary CB1 in the second direction D2. The first lower interconnection line LIL1 to which the source voltage VSS (i.e., a ground voltage) is applied may be disposed on the second cell boundary CB2. The first lower interconnection line LIL1 to which the source voltage VSS is applied may extend along the second cell boundary CB2 in the second direction D2.

The second lower interconnection lines LIL2 may be disposed between the first lower interconnection line LIL1 to which the drain voltage VDD is applied and the first lower interconnection line LIL1 to which the source voltage VSS is applied. The second lower interconnection lines LIL2 may extend in the second direction D2 in parallel to each other. Each of the second lower interconnection lines LIL2 may have a line or bar shape when viewed in a plan view. The second lower interconnection lines LIL2 may be arranged at a second pitch P2 in the first direction D1. The second pitch P2 may be less than the first pitch P1.

A line width of each of the first lower interconnection lines LIL1 may be a first width W1. A line width of each of the second lower interconnection lines LIL2 may be a second width W2. The second width W2 may be less than the first width W1, e.g., along a direction D1 parallel to the surface of the substrate 100. For example, the second width W2 may be less than about 12 nm. The first width W1 may be greater than about 12 nm.

Some of the lower vias VI may be disposed between the active contacts AC and the first and second lower interconnection lines LIL1 and LIL2. Others of the lower vias VI may be disposed between the gate contacts GC and the second lower interconnection lines LIL2.

An etch stop layer ESL may be disposed between the third and fourth interlayer insulating layers 130 and 140. The etch stop layer ESL may include a first etch stop layer ESL1 and a second etch stop layer ESL2. The first etch stop layer ESL1 may directly cover the first and second lower interconnection lines LIL1 and LIL2. The first etch stop layer ESL1 may cover a top surface of the third interlayer insulating layer 130. The second etch stop layer ESL2 may cover a top surface of the first etch stop layer ESL1.

The first etch stop layer ESL1 may be a high-k dielectric layer and may be a low-density layer. The first etch stop layer ESL1 may be a metal oxide layer or a metal nitride layer and may contain at least one metal selected from Al, Zr, Y, Hf, or Mo. For example, the first etch stop layer ESL1 may include aluminum oxide, hafnium oxide, hafnium-zirconium oxide, aluminum nitride, hafnium nitride, or hafnium-zirconium nitride.

The second etch stop layer ESL2 may be a low-k dielectric layer and may be a high-density layer. A dielectric constant of the second etch stop layer ESL2 may be lower than a dielectric constant of the first etch stop layer ESL1. A density of the second etch stop layer ESL2 may be higher than a density of the first etch stop layer ESL1.

The second etch stop layer ESL2 may contain X, Y, and carbon (C). Here, the 'X' may be an element selected from Si, Ge, Al, Zr, Y, Hf, or Mo, and the 'Y' may be O or N. For example, the second etch stop layer ESL2 may include SiOC, SiNC, GeOC, or GeNC.

A content (or concentration) of carbon (C) in the second etch stop layer ESL2 may range from about 10 at % to about 25 at %. In particular, the content of carbon (C) in the second etch stop layer ESL2 may range from about 15 at % to about 20 at %. A content (or concentration) of 'X' in the second etch stop layer ESL2 may range from about 30 at % to about 50 at %.

The second etch stop layer ESL2 may include a surface treatment region STR. For example, the surface treatment region STR may be a region to which extreme ultraviolet (EUV) light is irradiated. A content (or concentration) of carbon in the surface treatment region STR may be lower than a content (or concentration) of carbon in another region of the second etch stop layer ESL2. The content (or concentration) of carbon in the surface treatment region STR may range from about 1 at % to about 5 at %.

An etch stop pattern ESP may be provided on the surface treatment region STR of the second etch stop layer ESL2. The etch stop pattern ESP may vertically overlap with the surface treatment region STR. The etch stop pattern ESP may include a metal oxide and may contain at least one metal selected from Al, Zr, Y, Hf, or Mo. For example, the etch stop pattern ESP may include aluminum oxide.

In some embodiments, the etch stop pattern ESP may include the same material as the first etch stop layer ESL1. In certain embodiments, the etch stop pattern ESP may include a different material from that of the first etch stop layer ESL1. A dielectric constant of the etch stop pattern ESP may be higher than the dielectric constant of the second etch stop layer ESL2. A density of the etch stop pattern ESP may be lower than the density of the second etch stop layer ESL2.

The fourth interlayer insulating layer 140 may cover the etch stop pattern ESP and a top surface of the second etch stop layer ESL2 which is not covered by the etch stop pattern ESP. A second metal layer M2 may be provided in the fourth interlayer insulating layer 140. The second metal layer M2 may include upper interconnection lines UIL. The upper interconnection lines UIL may extend in the first direction D1 in parallel to each other. Each of the upper interconnection lines UIL may have a line or bar shape when viewed in a plan view. The upper interconnection lines UIL may be arranged in the second direction D2.

The upper interconnection line UIL may include a line portion HEP and a via portion VEP. The line portion HEP may be provided in an upper portion of the fourth interlayer insulating layer 140 and may extend in the first direction D1. The via portion VEP may be provided in a lower portion of the fourth interlayer insulating layer 140 and may extend from the line portion HEP toward the first metal layer M1. In other words, the via portion VEP may be a via disposed between the line portion HEP and the first metal layer M1 to connect the line portion HEP to the first metal layer M1.

The via portion VEP may extend toward the first metal layer M1 while penetrating the fourth interlayer insulating layer 140, the etch stop pattern ESP, and the etch stop layer ESL. In other words, the etch stop pattern ESP may be adjacent to the via portion VEP and may be in contact with a sidewall of the via portion VEP.

The line portion HEP and the via portion VEP may be connected to each other in one body (i.e., a unitary structure) to constitute a single conductor, i.e., a single upper interconnection line UIL. The line portion HEP and the via portion VEP may be formed into the single upper interconnection line UIL through a dual damascene process.

The second lower interconnection line LIL2, the upper interconnection line UIL, the etch stop layer ESL and the etch stop pattern ESP according to the present embodiments will be described in more detail with reference to FIG. 3.

The second lower interconnection line LIL2 may include a barrier metal pattern BAP, a metal pattern MEP on the barrier metal pattern BAP, and a metal capping pattern CAP on the metal pattern MEP.

The barrier metal pattern BAP may have a U-shape. A top surface of the barrier metal pattern BAP may be substantially coplanar with a top surface of the third interlayer insulating layer 130. Alternatively, the top surface of the barrier metal pattern BAP may be lower than the top surface of the third interlayer insulating layer 130.

The barrier metal pattern BAP may improve adhesion between the second lower interconnection line LIL2 and the third interlayer insulating layer 130. The barrier metal pattern BAP may function as a barrier for reducing or preventing a metal element of the metal pattern MEP from being diffused into the third interlayer insulating layer 130. The barrier metal pattern BAP may include at least one of a tantalum nitride (TaN) layer, a titanium nitride (TiN) layer, a tantalum oxide (TaO) layer, a titanium oxide (TiO) layer, a manganese nitride (MnN) layer, or a manganese oxide (MnO) layer.

The metal pattern MEP may be provided on the barrier metal pattern BAP. The barrier metal pattern BAP may cover a bottom surface and both (e.g., opposing) sidewalls of the metal pattern MEP. The metal pattern MEP may have a convex top surface. The highest level of the top surface of the metal pattern MEP may be lower than the top surface of the third interlayer insulating layer 130. The metal pattern MEP may have the greatest volume among the components constituting the second lower interconnection line LIL2. For example, the metal pattern MEP may include copper (Cu), ruthenium (Ru), cobalt (Co), tungsten (W), or molybdenum (Mo).

The metal capping pattern CAP may cover the top surface of the metal pattern MEP. The metal capping pattern CAP may have a thin and uniform thickness. For example, the metal capping pattern CAP may include ruthenium (Ru), cobalt (Co), or graphene.

The first etch stop layer ESL1 may cover a top surface of the second lower interconnection line LIL2 and the third interlayer insulating layer 130. The first etch stop layer ESL1 may have a first thickness T1 on the top surface of the third interlayer insulating layer 130, e.g., along a direction D3 that is normal to a surface of the substrate 100. For example, the first thickness T1 may range from about 2 nm to about 5 nm.

The second etch stop layer ESL2 may cover the top surface of the first etch stop layer ESL1. The second etch stop layer ESL2 may have a second thickness T2. The second thickness T2 may be greater than the first thickness T1. For example, the second thickness T2 may range from about 3 nm to about 10 nm.

The surface treatment region STR of the second etch stop layer ESL2 may vertically overlap (i.e., may overlap along a direction normal to the surface of the substrate 100, e.g., along direction D3) with the second lower interconnection line LIL2. In a concentration distribution of carbon in the surface treatment region STR of the second etch stop layer ESL2, the concentration of carbon may increase as a distance from a top surface of the surface treatment region STR toward the first etch stop layer ESL1 increases, that is, the concentration of carbon may increase with distance from a top surface of the surface treatment region STR toward the first etch stop layer ESL1. A concentration of carbon of the second etch stop layer ESL2 may have a minimum value (e.g., about 3 at %) at the top surface of the surface treatment region STR. A concentration of carbon of the second etch stop layer ESL2 adjacent to the first etch stop layer ESL1 may be a maximum value (e.g., about 20 at %). A concentration of carbon of one or more other regions of the second etch stop layer ESL2 different than the surface treatment region STR may be substantially equal to the maximum value.

The etch stop pattern ESP may be provided on the surface treatment region STR of the second etch stop layer ESL2. A maximum thickness of the etch stop pattern ESP may be a third thickness T3. The third thickness T3 may be less than the second thickness T2, e.g., along direction D3. For example, the third thickness T3 may range from about 2 nm to about 5 nm. A thickness of the etch stop pattern ESP may decrease as a horizontal distance from the via portion VEP increases. The other region(s) of the second etch stop layer ESL2 except or different than the surface treatment region STR may be covered by the fourth interlayer insulating layer 140.

The via portion VEP of the upper interconnection line UIL may penetrate the etch stop pattern ESP and the etch stop layer ESL so as to be in contact with the top surface of the second lower interconnection line LIL2. The first etch stop layer ESL1, the second etch stop layer ESL2 and the etch stop pattern ESP may function as a triple etch stop layer having a three-layer structure.

A very high etch selectivity may be realized by the triple etch stop layer ESL1, ESL2, ESP according to the present embodiments. Thus, the via portion VEP of the upper interconnection line UIL may be in stable contact with the top surface of the second lower interconnection line LIL2 without a process defect.

As described above, the etch stop pattern ESP and the first etch stop layer ESL1 may include the high-k dielectric materials. Thus, if respective volumes of the etch stop pattern ESP and the first etch stop layer ESL1 increase, a capacitance between the first and second metal layers M1 and M2 may be increased to deteriorate performance of a device.

However, the etch stop pattern ESP according to the present embodiments may not be provided on an entire surface of the second etch stop layer ESL2 but may be partially provided on only the surface treatment region STR which the via portion VEP of the upper interconnection line UIL penetrates. In other words, the etch stop pattern ESP may have a reduced or minimum volume for performing the function of an etch stop layer. Since the size or volume of the etch stop pattern ESP is reduced or minimized, a capacitance between the first and second metal layers M1 and M2 may be reduced to improve performance of the device.

The via portion VEP of the upper interconnection line UIL may have a first sidewall SW1 being in contact with the fourth interlayer insulating layer 140, and a second sidewall SW2 being in contact with the etch stop layer ESL. In some examples, the first sidewall SW1 and the second sidewall SW2 may have substantially the same gradient. In other examples, the first sidewall SW1 and the second sidewall SW2 may have different gradients.

The via portion VEP may further have an intermediate surface DS extending between the first sidewall SW1 and the second sidewall SW2. The intermediate surface DS may be located at or adjacent an interface between the second etch stop layer ESL2 and the etch stop pattern ESP. The intermediate surface DS may be substantially flat. In other words, a gradient of the intermediate surface DS may be gentler or less steep than the gradient of each of the first and second sidewalls SW1 and SW2. The intermediate surface DS may be a place at which a sidewall gradient of the via portion VEP is suddenly changed or discontinuously transitions between the first sidewall SW1 and the second sidewall SW2.

A width of the via portion VEP in the first direction D1 may be suddenly changed (e.g., in a stepwise transition between two distinct widths) by or at the intermediate surface DS. The width of the via portion VEP may become less from the line portion HEP toward the second lower interconnection line LIL2 and may be suddenly reduced at a location of the intermediate surface DS is located.

The regions of the via portion VEP in contact with the etch stop pattern ESP may have a third width W3 in the first direction D1. A maximum width of the etch stop pattern ESP in the first direction D1 may be a fourth width W4. The fourth width W4 may range from about 1.2 times to about 3 times the third width W3. The maximum width W4 of the etch stop pattern ESP may be confined within a width of the surface treatment region STR. In other words, the etch stop pattern ESP having the higher dielectric constant may have a reduced or minimum area for performing the function of an etch stop layer, thereby reducing the associated capacitance.

Figure 9A:
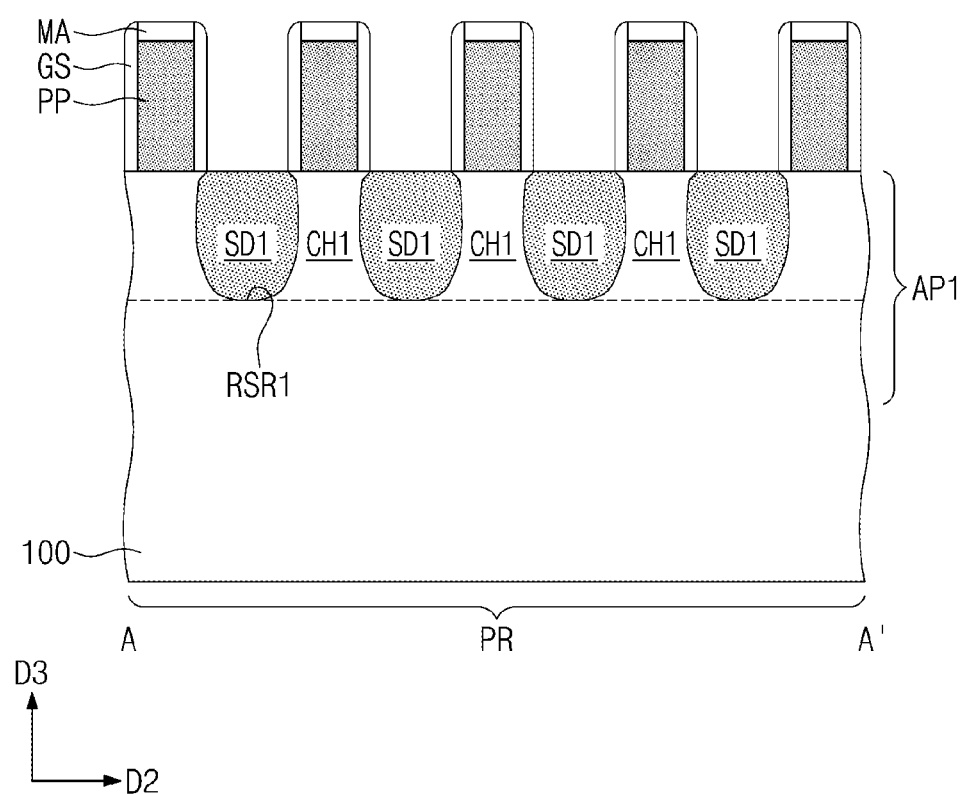
Figure 9B:
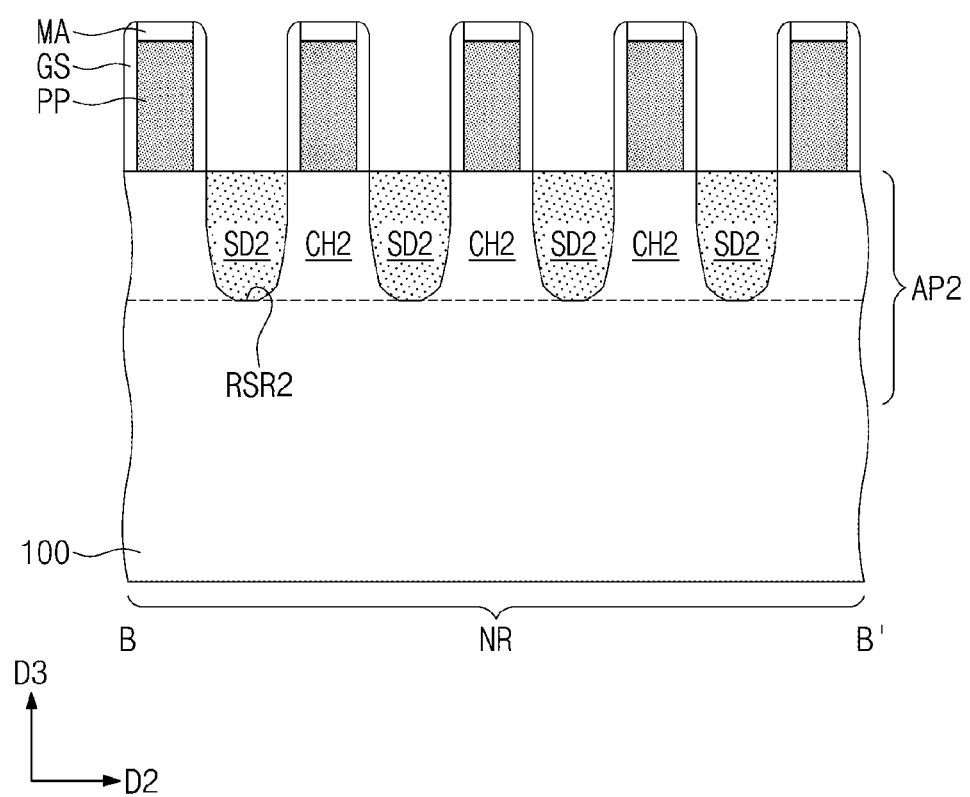
Figure 9C:
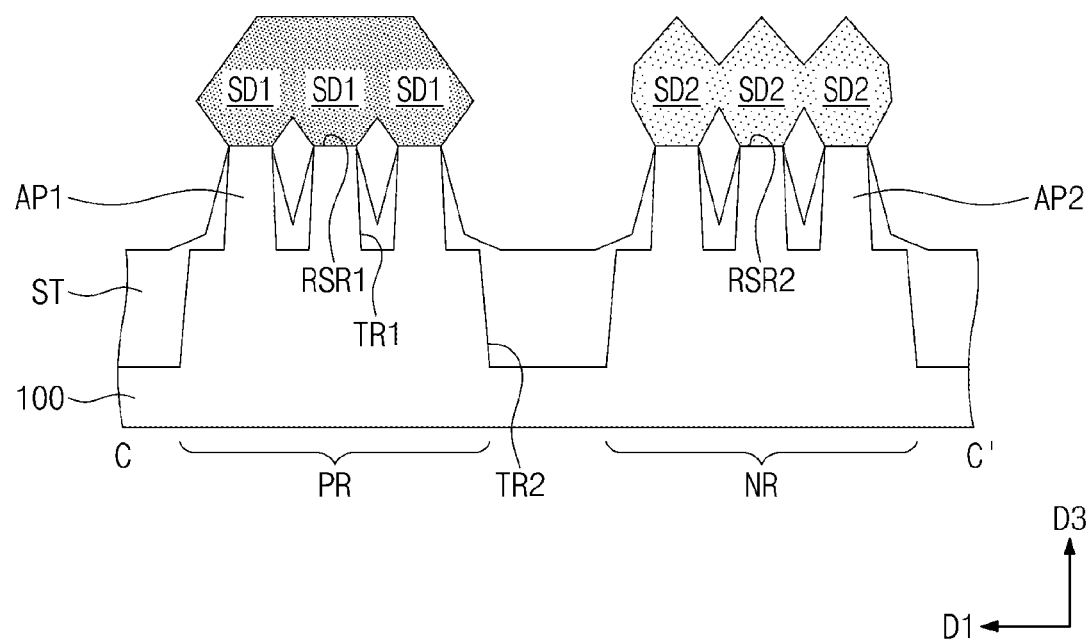
FIGS. 9C and 11C are cross-sectional views taken along lines C-C' of FIGS. 8 and 10, respectively.
Figure 9D:
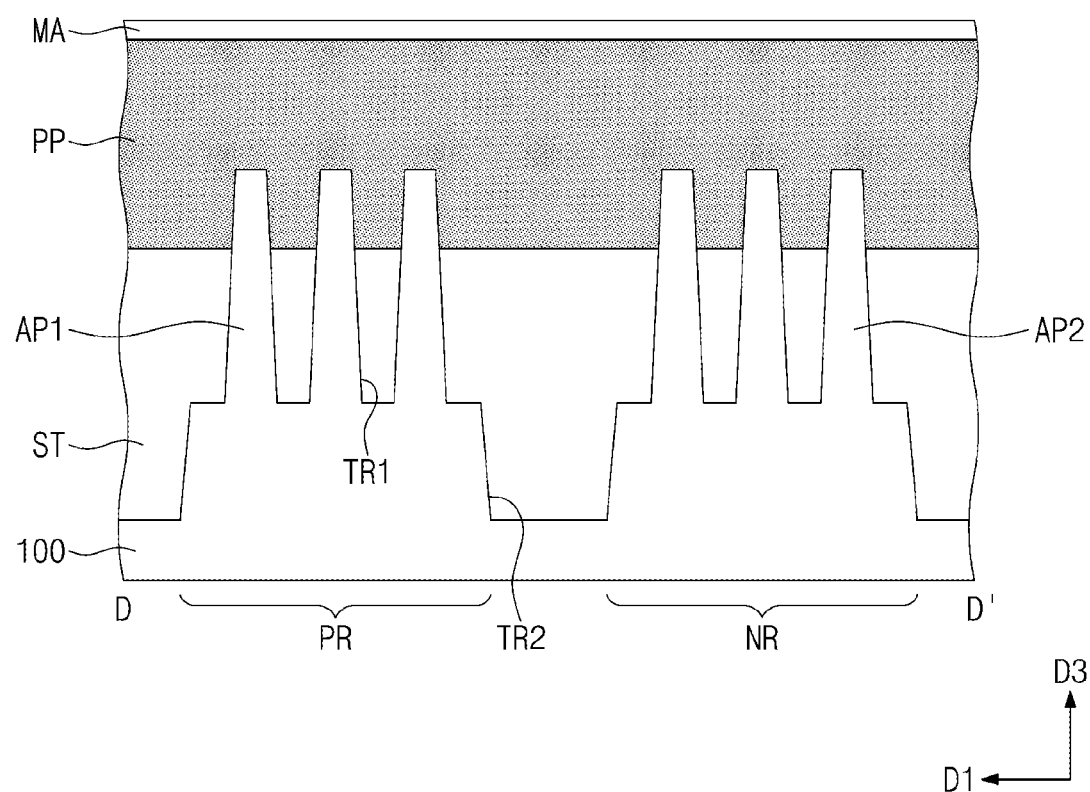
FIGS. 9D and 11D are cross-sectional views taken along lines D-D' of FIGS. 8 and 10, respectively.
Figure 10:
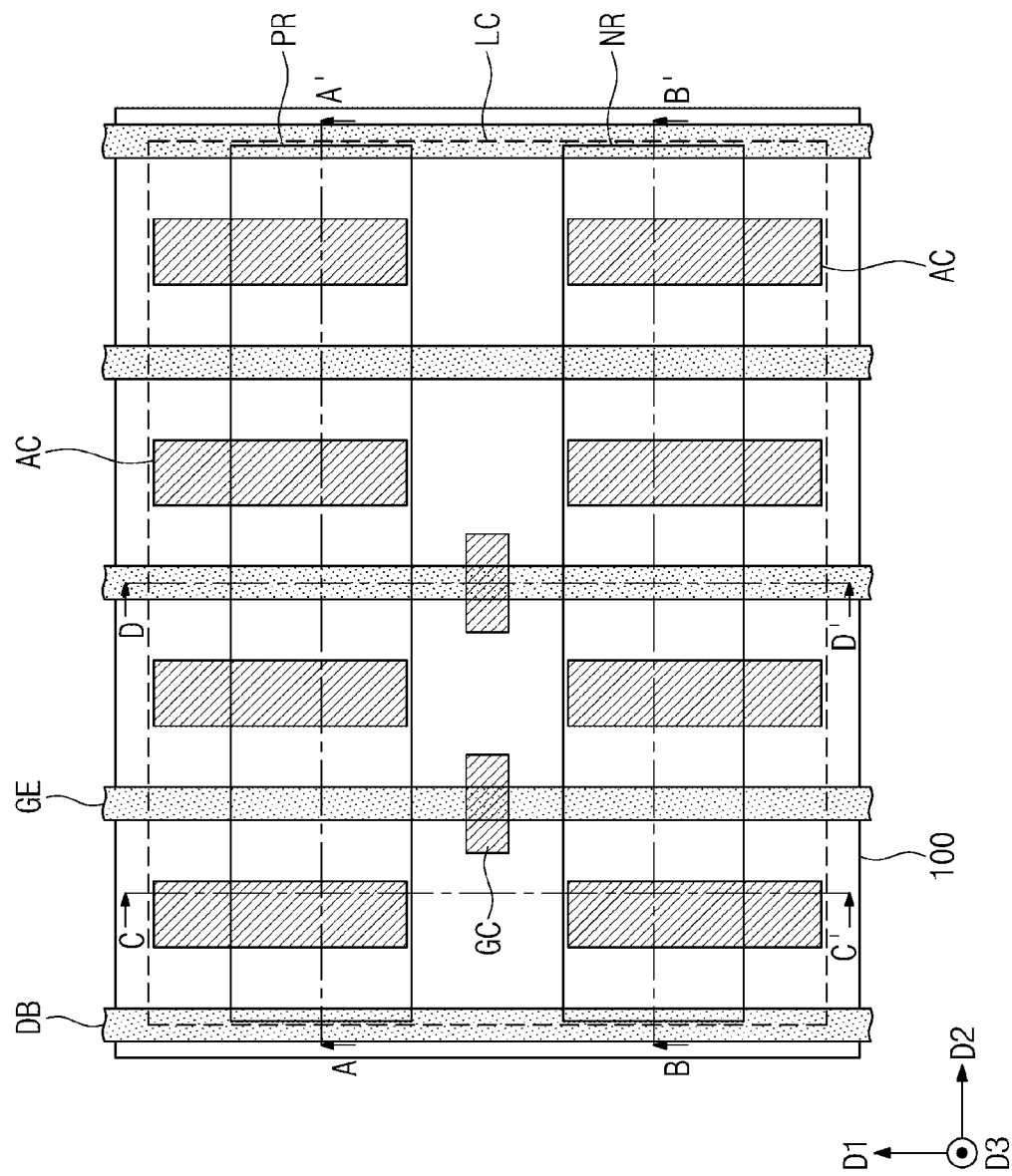
Figure 11A:
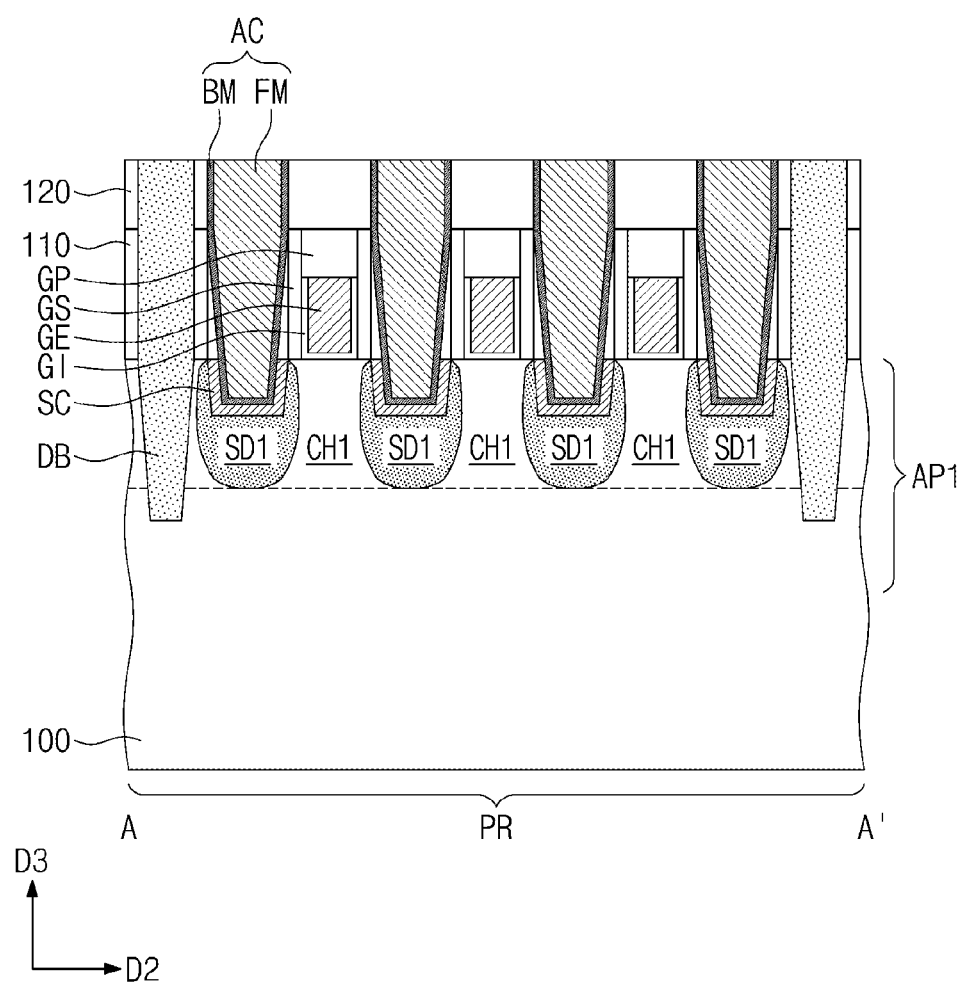
Figure 11B:
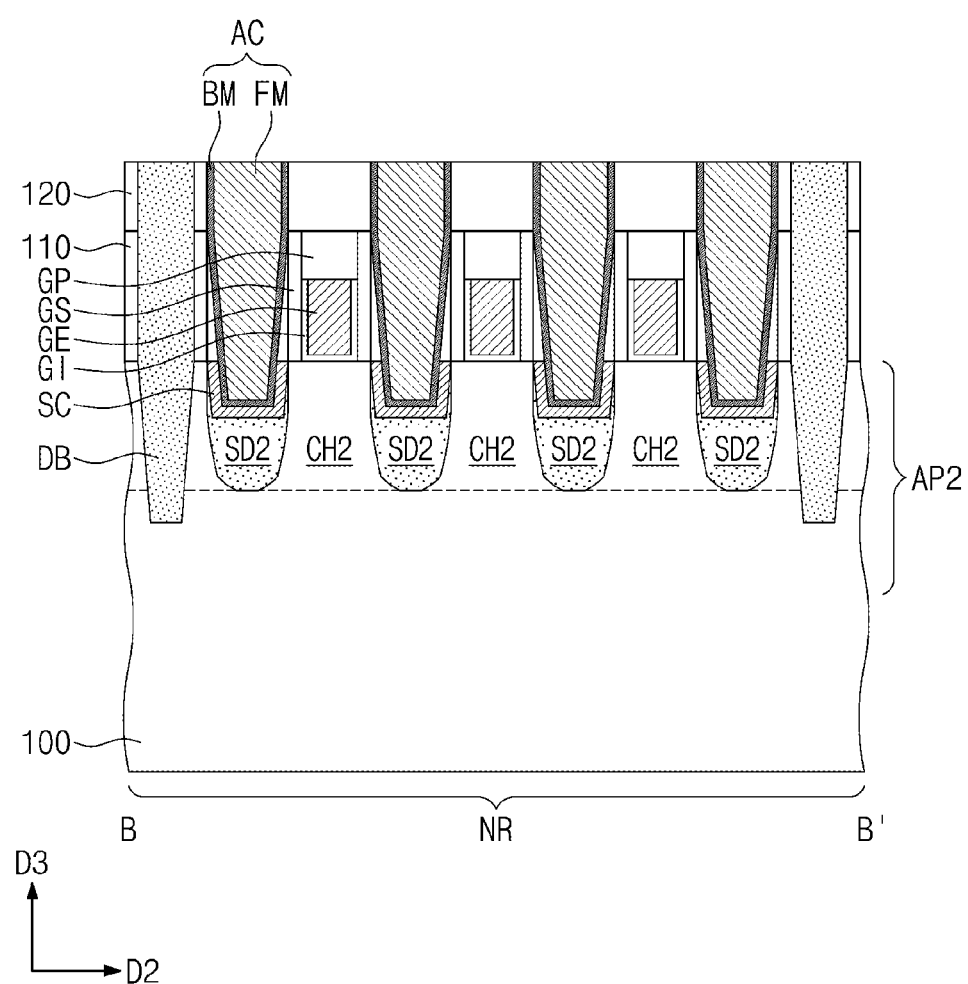
Figure 11C:
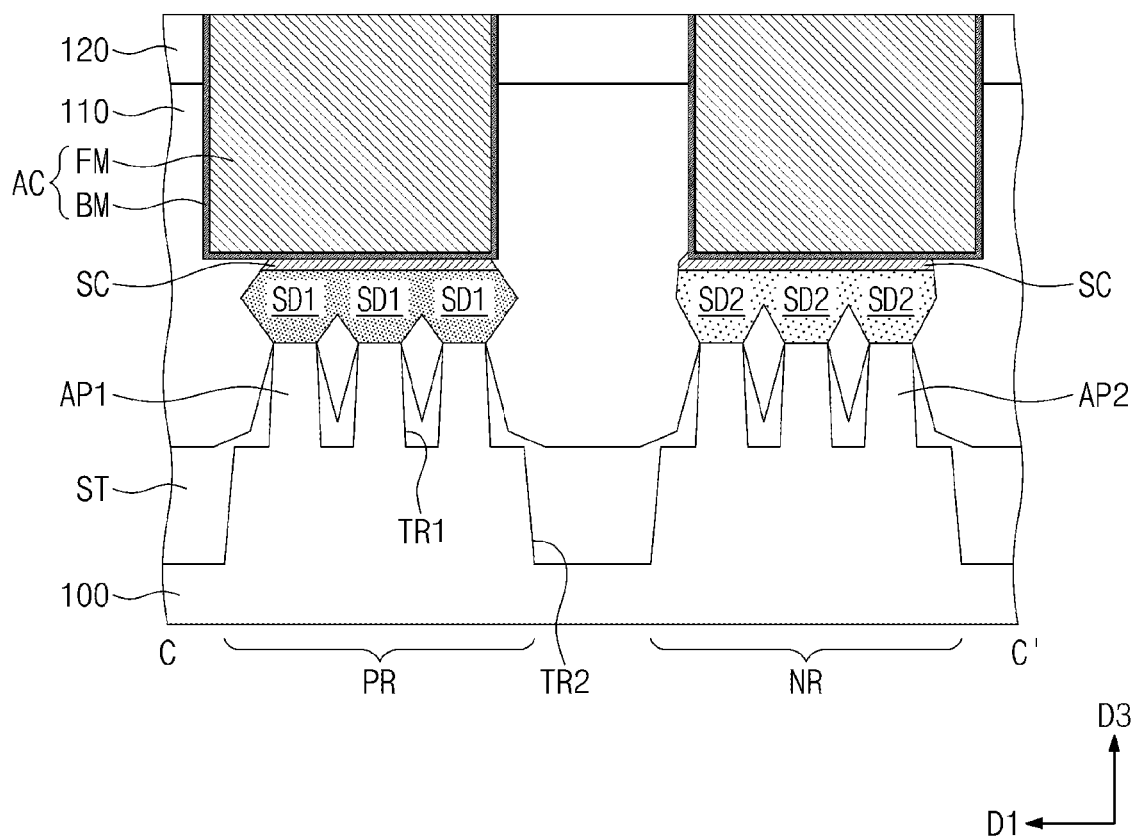
Figure 11D:
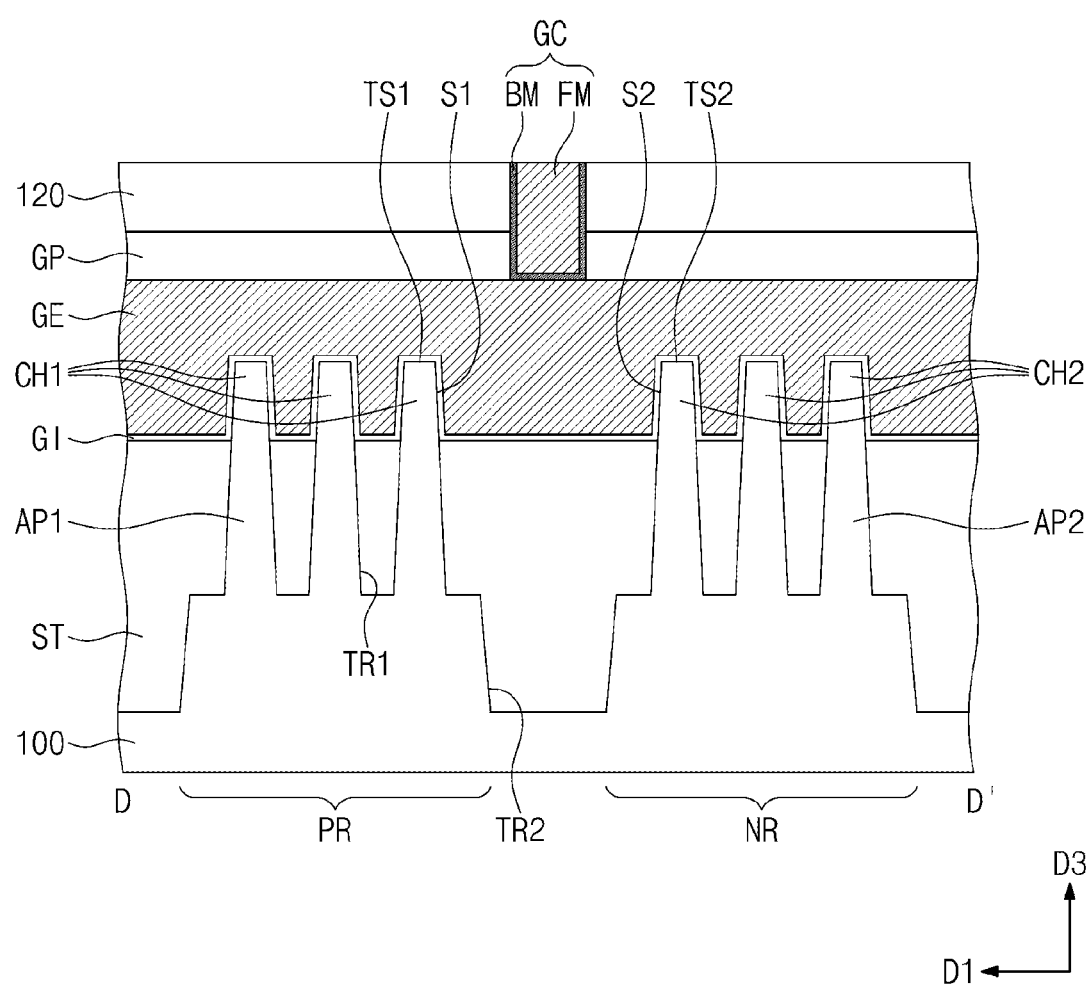

FIGS. 4, 6, 8 and 10 are plan views illustrating a method of manufacturing a semiconductor device according to some embodiments of the inventive concepts. FIGS. 5, 7A, 9A and 11A are cross-sectional views taken along lines A-A' of FIGS. 4, 6, 8 and 10, respectively. FIGS. 7B, 9B and 11B are cross-sectional views taken along lines B-B' of FIGS. 6, 8 and 10, respectively. FIGS. 9C and 11C are cross-sectional views taken along lines C-C' of FIGS. 8 and 10, respectively. FIGS. 9D and 11D are cross-sectional views taken along lines D-D' of FIGS. 8 and 10, respectively.

Figure 4:
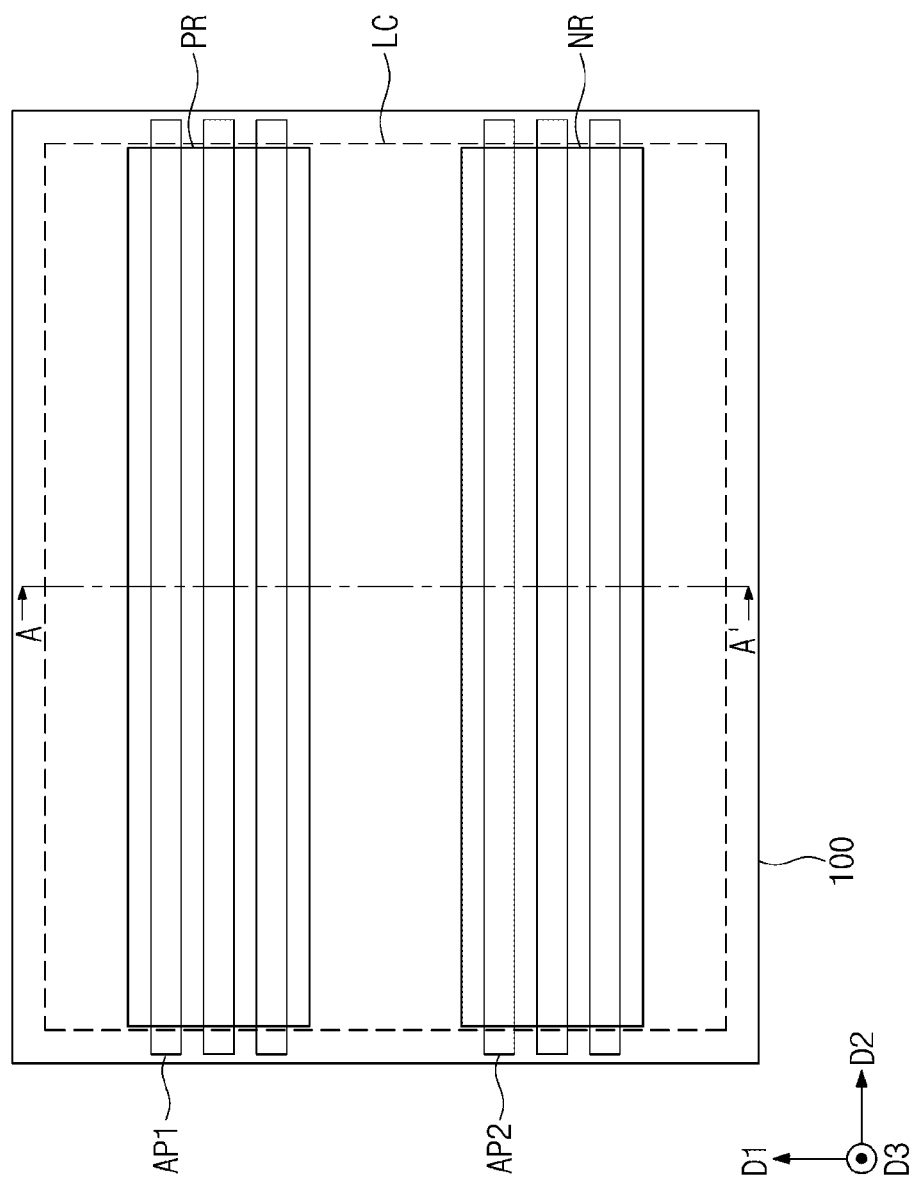
FIGS. 4, 6, 8 and 10 are plan views illustrating a method of manufacturing a semiconductor device according to some embodiments of the inventive concepts.
Figure 5:
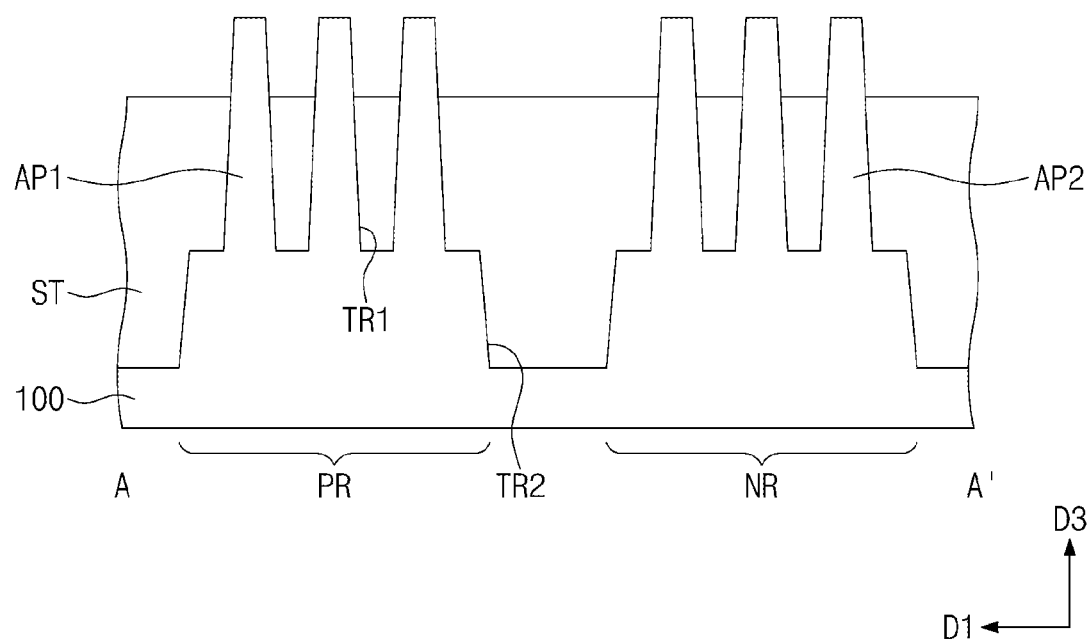
FIGS. 5, 7A, 9A and 11A are cross-sectional views taken along lines A-A' of FIGS. 4, 6, 8 and 10, respectively.

Referring to FIGS. 4 and 5, a substrate 100 including a first active region PR and a second active region NR may be provided. The first active region PR and the second active region NR may define a logic cell LC on the substrate 100.

The substrate 100 may be patterned to form first and second active patterns AP1 and AP2. The first active patterns AP1 may be formed on the first active region PR, and the second active patterns AP2 may be formed on the second active region NR. First trenches TR1 may be formed between the first active patterns AP1 and between the second active patterns AP2. The substrate 100 may be patterned to form a second trench TR2 between the first active region PR and the second active region NR. The second trench TR2 may be deeper than the first trench TR1.

A device isolation layer ST may be formed on the substrate 100 to fill the first and second trenches TR1 and TR2. The device isolation layer ST may include an insulating material such as a silicon oxide layer. The device isolation layer ST may be recessed until upper portions of the first and second active patterns AP1 and AP2 are exposed. Thus, the upper portions of the first and second active patterns AP1 and AP2 may vertically protrude upward from the device isolation layer ST, that is, away from the substrate 100.

Figure 6:
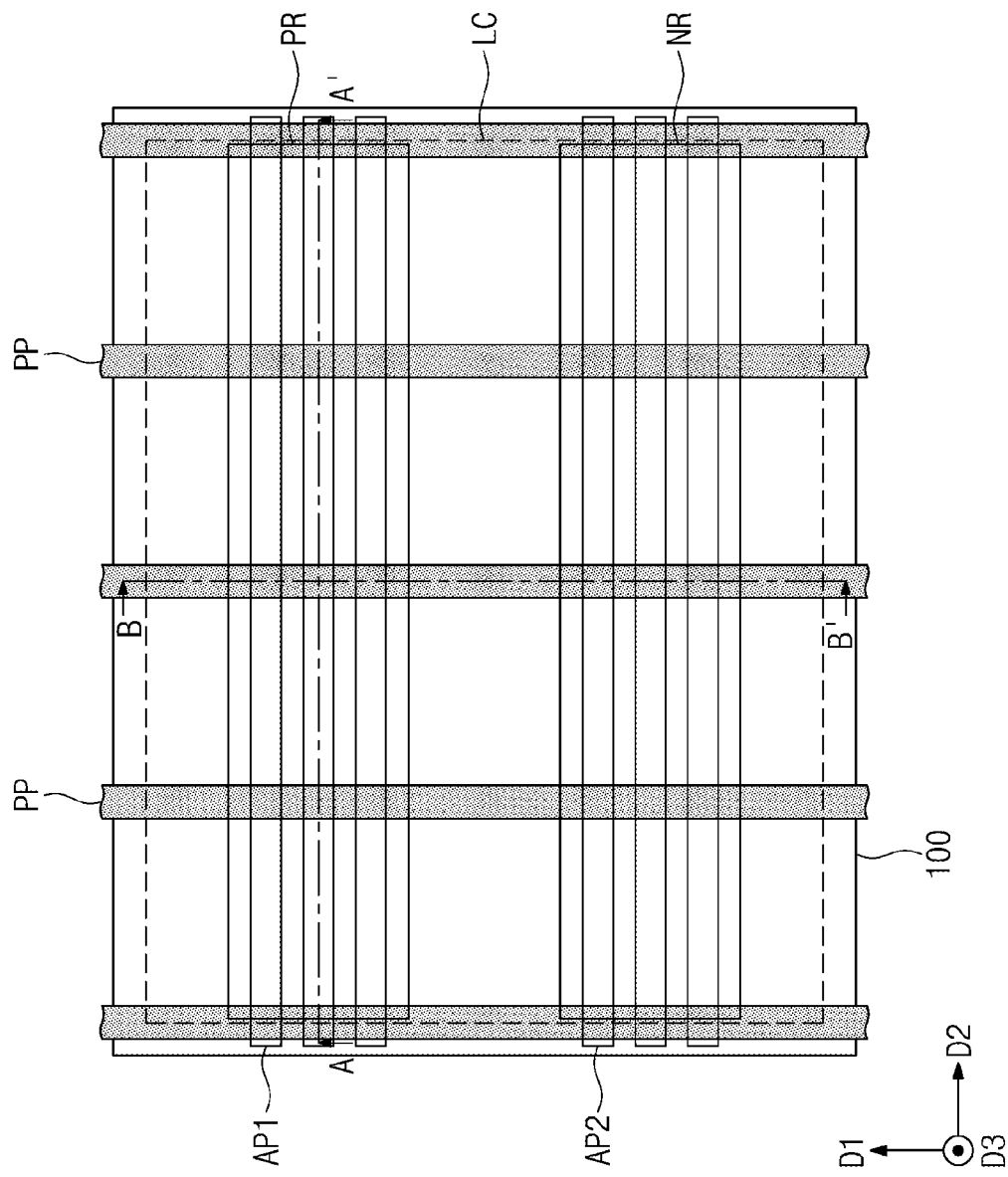
Figure 7A:
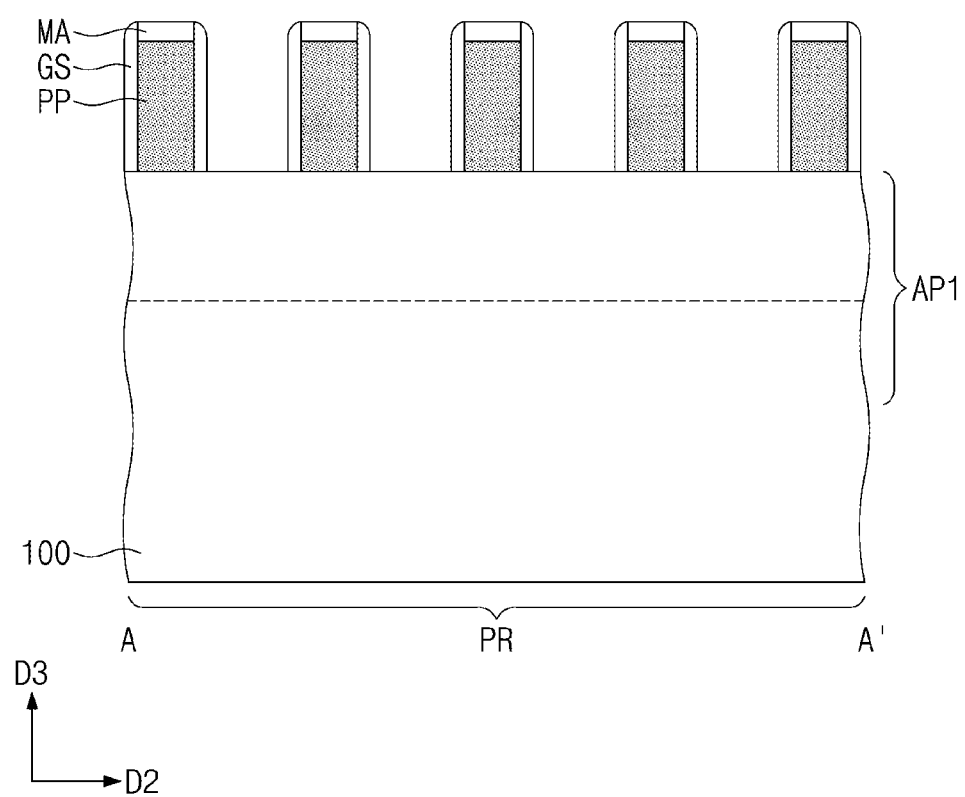
Figure 7B:
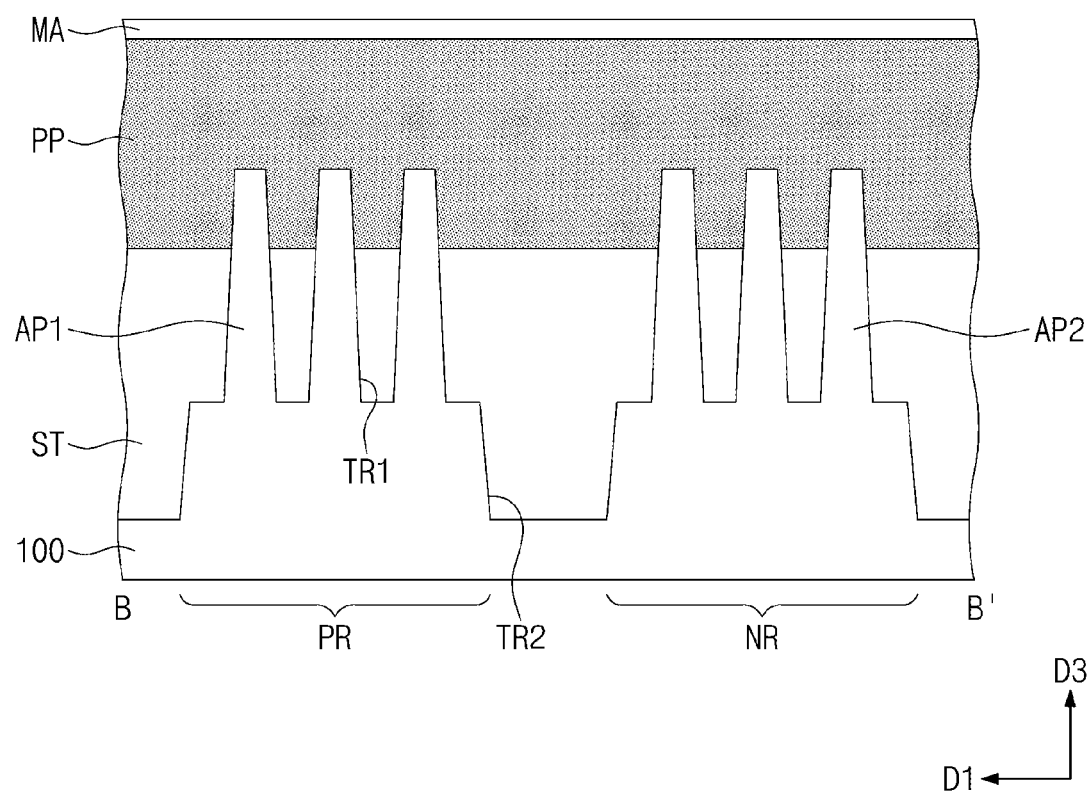
FIGS. 7B, 9B and 11B are cross-sectional views taken along lines B-B' of FIGS. 6, 8 and 10, respectively.
Figure 8:
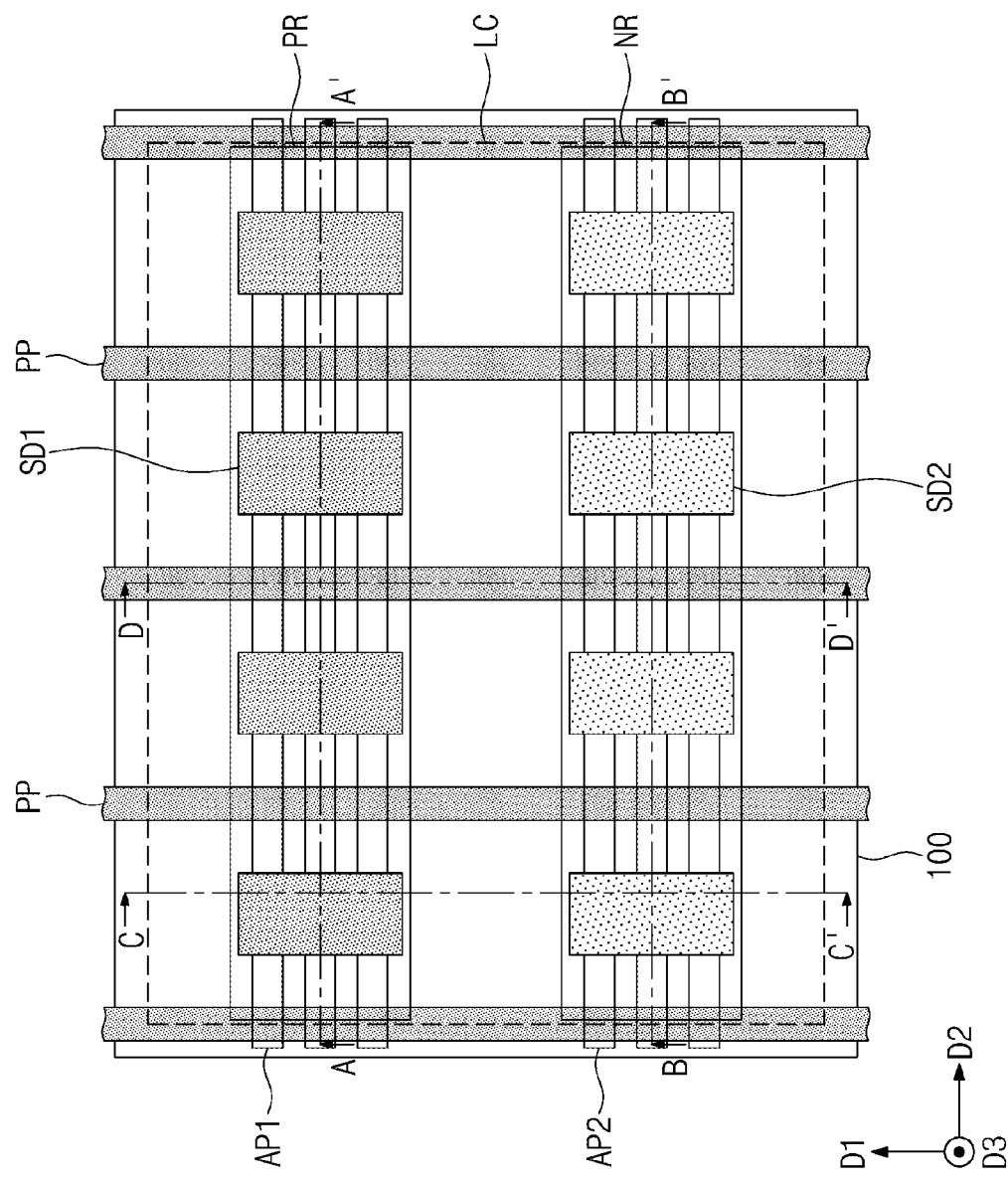

Referring to FIGS. 6, 7A and 7B, sacrificial patterns PP may be formed to intersect the first and second active patterns AP1 and AP2. The sacrificial patterns PP may have line shapes or bar shapes, which extend in the first direction D1. As illustrated in FIG. 1, the sacrificial patterns PP may be arranged at the first pitch P1 in the second direction D2.

For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include poly-silicon.

A pair of gate spacers GS may be formed on both (e.g., opposing) sidewalls of each of the sacrificial patterns PP, respectively. The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In certain embodiments, the gate spacer layer may be formed of a multi-layer including at least two of SiCN, SiCON, or SiN.

Referring to FIGS. 8 and 9A to 9D, first source/drain patterns SD1 may be formed in the upper portion of the first active pattern AP1. A pair of the first source/drain patterns SD1 may be formed at both (e.g., opposing) sides of each of the sacrificial patterns PP.

In detail, the upper portion of the first active pattern AP1 may be etched using the hard mask patterns MA and the gate spacers GS as etch masks to form first recesses RSR1. The device isolation layer ST between the first active patterns AP1 may be recessed while the upper portions of the first active patterns AP1 are etched (see FIG. 9C).

The first source/drain patterns SD1 may be formed by performing a selective epitaxial growth (SEG) process using inner surfaces of the first recesses RSR1 of the first active pattern AP1 as a seed layer. Since the first source/drain patterns SD1 are formed, a first channel pattern CH1 may be defined between the pair of first source/drain patterns SD1. For example, the SEG process may include a chemical vapor deposition (CVD) process or a molecular beam epitaxy (MBE) process. The first source/drain patterns SD1 may include a semiconductor element (e.g., SiGe) of which a lattice constant is greater than that of a semiconductor element of the substrate 100. In some embodiments, each of the first source/drain patterns SD1 may be formed of a plurality of stacked semiconductor layers.

In some embodiments, dopants may be injected in-situ into the first source/drain patterns SD1 during the SEG process for forming the first source/drain patterns SD1. In certain embodiments, the dopants may be injected or implanted into the first source/drain patterns SD1 after the SEG process for forming the first source/drain patterns SD1. The first source/drain patterns SD1 may be doped with the dopants to have a first conductivity type (e.g., P-type).

Second source/drain patterns SD2 may be formed in the upper portion of the second active pattern AP2. A pair of the second source/drain patterns SD2 may be formed at both or opposing sides of each of the sacrificial patterns PP.

In detail, the upper portion of the second active pattern AP2 may be etched using the hard mask patterns MA and the gate spacers GS as etch masks to form second recesses RSR2. The second source/drain patterns SD2 may be formed by performing a SEG process using inner surfaces of the second recesses RSR2 of the second active pattern AP2 as a seed layer. Since the second source/drain patterns SD2 are formed, a second channel pattern CH2 may be defined between the pair of second source/drain patterns SD2. For example, the second source/drain patterns SD2 may include the same semiconductor element (e.g., silicon) as the substrate 100. The second source/drain patterns SD2 may be doped with dopants to have a second conductivity type (e.g., N-type).

The first source/drain patterns SD1 and the second source/drain patterns SD2 may be sequentially formed by different processes from each other. In other words, the first source/drain patterns SD1 may not be formed simultaneously with the second source/drain patterns SD2.

Referring to FIGS. 10 and 11A to 11D, a first interlayer insulating layer 110 may be formed to cover the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized until top surfaces of the sacrificial patterns PP are exposed. The planarization process of the first interlayer insulating layer 110 may be performed using an etch-back process or a chemical mechanical polishing (CMP) process. The hard mask patterns MA may be completely removed during the planarization process. As a result, a top surface of the first interlayer insulating layer 110 may be substantially coplanar with the top surfaces of the sacrificial patterns PP and top surfaces of the gate spacers GS.

The sacrificial patterns PP may be replaced with gate electrodes GE, respectively. In more detail, the exposed sacrificial patterns PP may be selectively removed. Empty spaces may be formed by the removal of the sacrificial patterns PP. A gate dielectric pattern GI, the gate electrode GE and a gate capping pattern GP may be formed in each of the empty spaces. The gate electrode GE may include a first metal and a second metal on the first metal. The first metal may be formed of a work function metal capable of adjusting a threshold voltage of a transistor, and the second metal may be formed of a low-resistance metal.

A second interlayer insulating layer 120 may be formed on the first interlayer insulating layer 110. The second interlayer insulating layer 120 may include a silicon oxide layer. Active contacts AC may be formed in the second and first interlayer insulating layers 120 and 110. The active contacts AC may penetrate the second and first interlayer insulating layers 120 and 110 so as to be electrically connected to the first and second source/drain patterns SD1 and SD2. A gate contact GC may penetrate the second interlayer insulating layer 120 and the gate capping pattern GP so as to be electrically connected to the gate electrode GE.

A pair of isolation structures DB may be respectively formed at both sides of the logic cell LC, which are opposite to each other in the second direction D2. The isolation structures DB may be formed to overlap with the gate electrodes GE formed at the both sides of the logic cell LC, respectively. For example, the formation of the isolation structures DB may include forming holes which penetrate the first and second interlayer insulating layers 110 and 120 and the gate electrodes GE and extend into the first and second active patterns AP1 and AP2, and filling the holes with an insulating layer.

Referring again to FIGS. 1 and 2A to 2D, a third interlayer insulating layer 130 may be formed on the second interlayer insulating layer 120. A first metal layer M1 may be formed in the third interlayer insulating layer 130. The formation of the first metal layer M1 may include forming first lower interconnection lines LIL1, second lower interconnection lines LIL2, and lower vias VI.

An etch stop layer ESL may be formed on the first metal layer M1. A fourth interlayer insulating layer 140 may be formed on the etch stop layer ESL. A second metal layer M2 may be formed in the fourth interlayer insulating layer 140. The formation of the second metal layer M2 may include forming upper interconnection lines UIL. For example, the upper interconnection lines UIL may be formed by a dual damascene process.

Figure 2A:
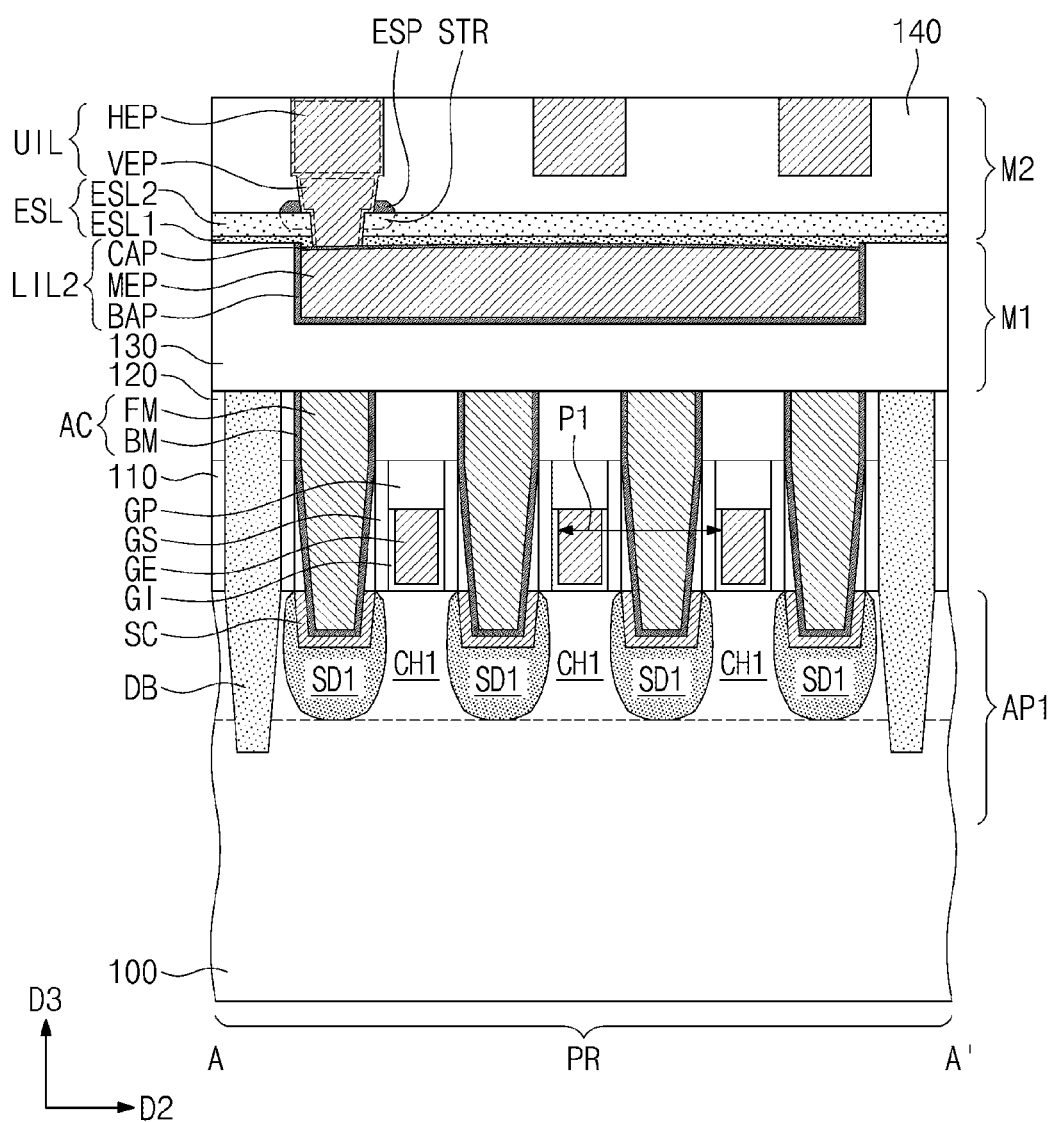
FIGS. 2A, 2B, 2C and 2D are cross-sectional views taken along lines A-A', B-B', C-C' and D-D' of FIG. 1, respectively.
Figure 2B:
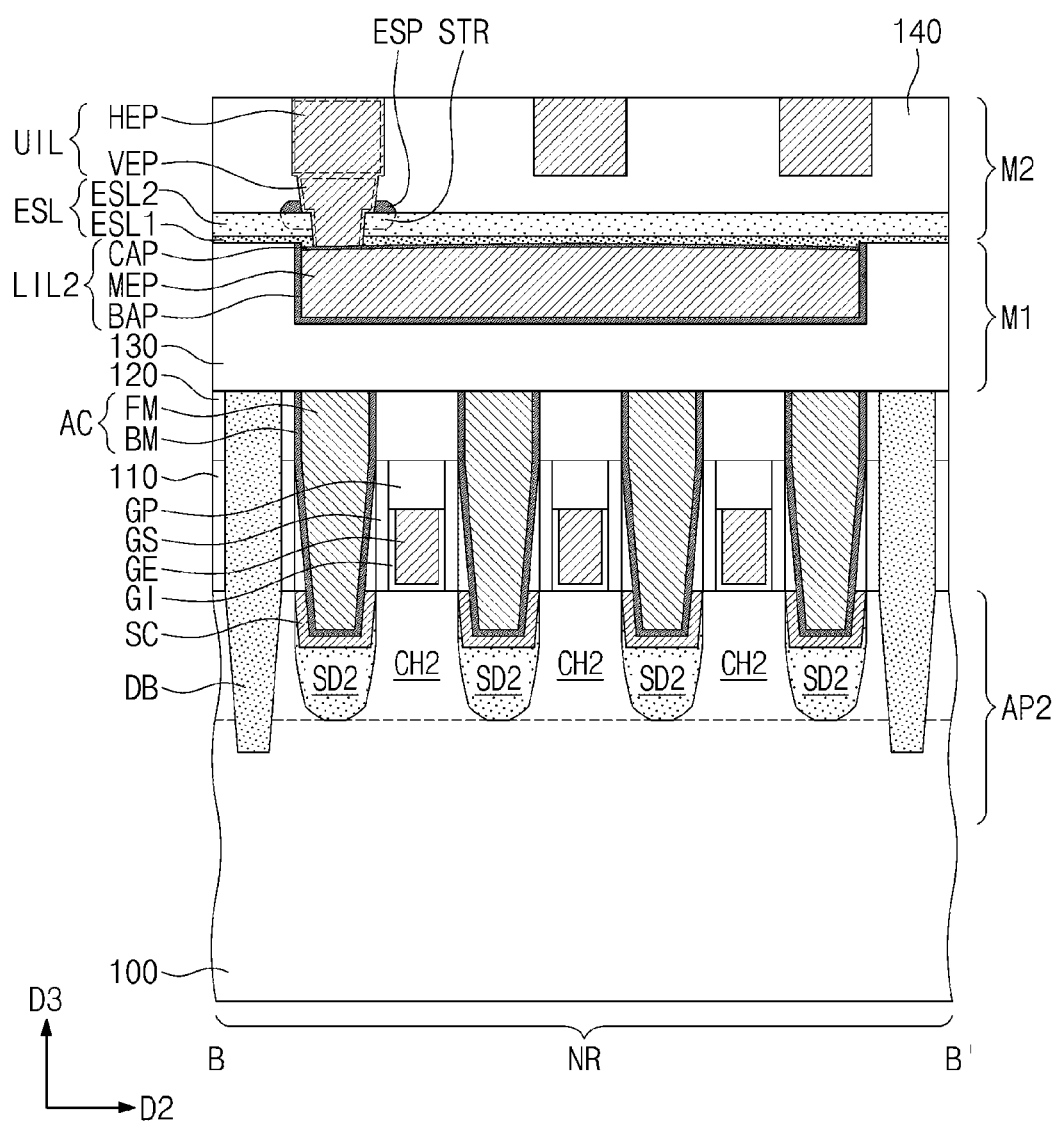
Figure 2C:
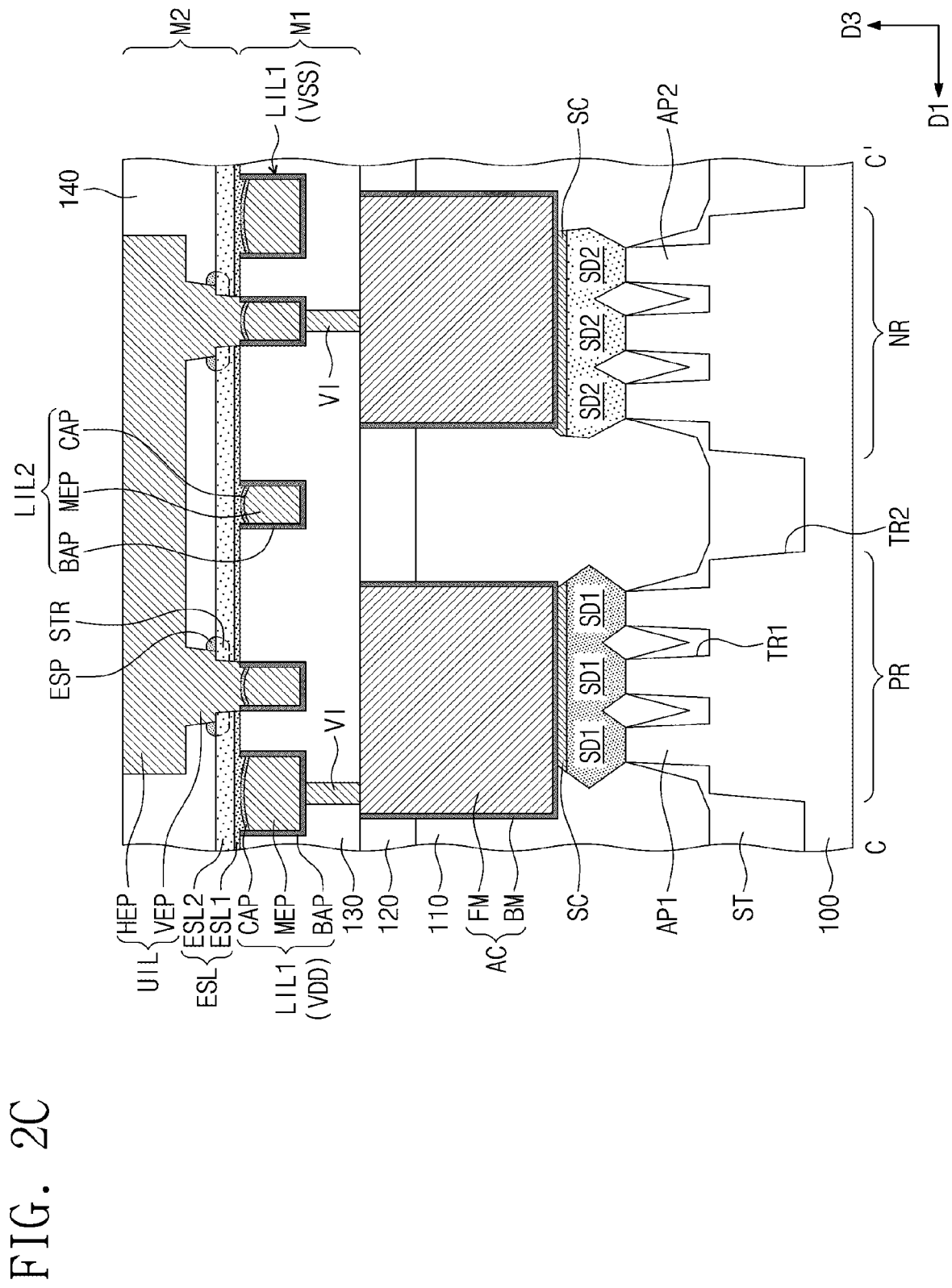
Figure 2D:
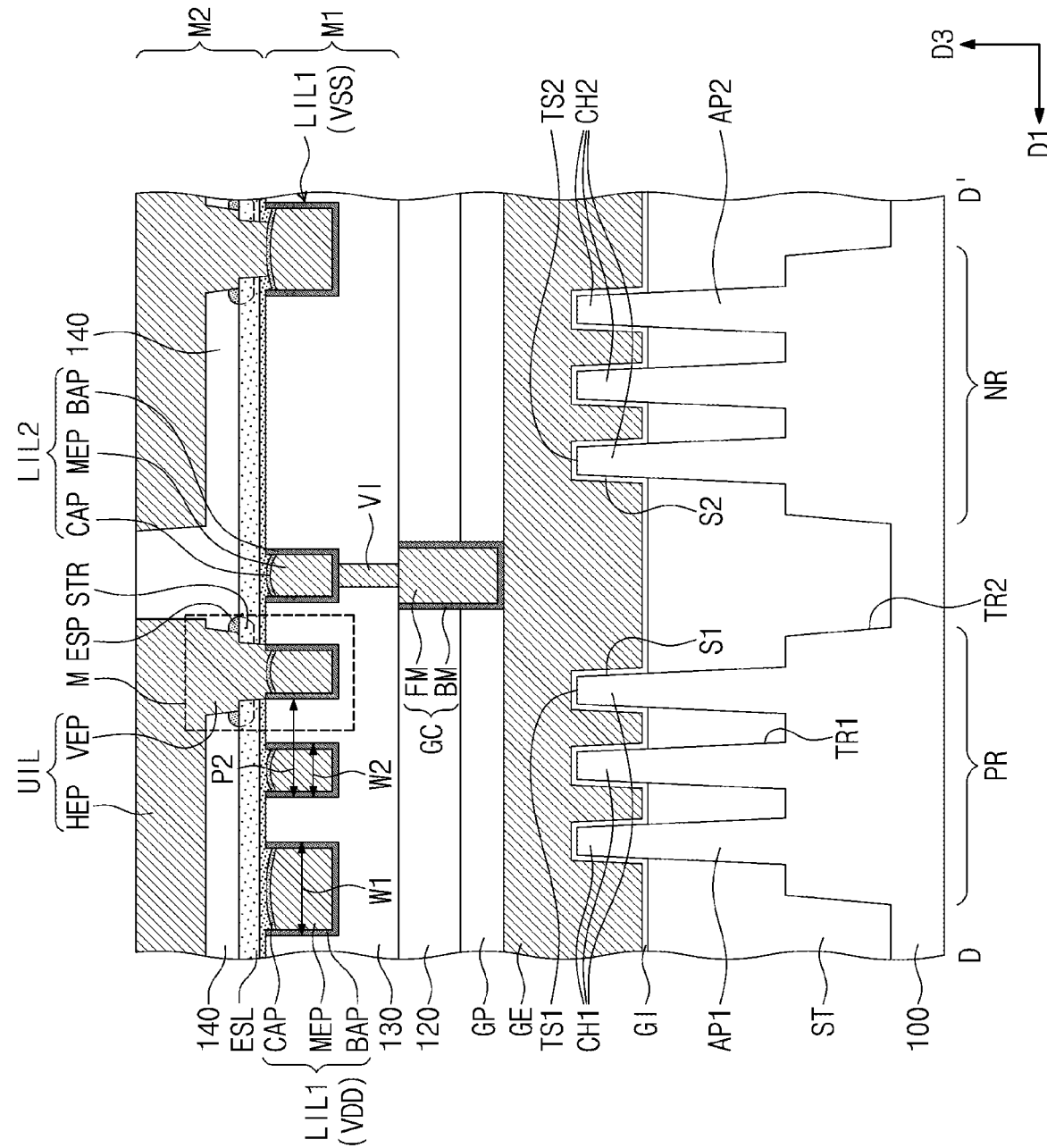
Figure 3:
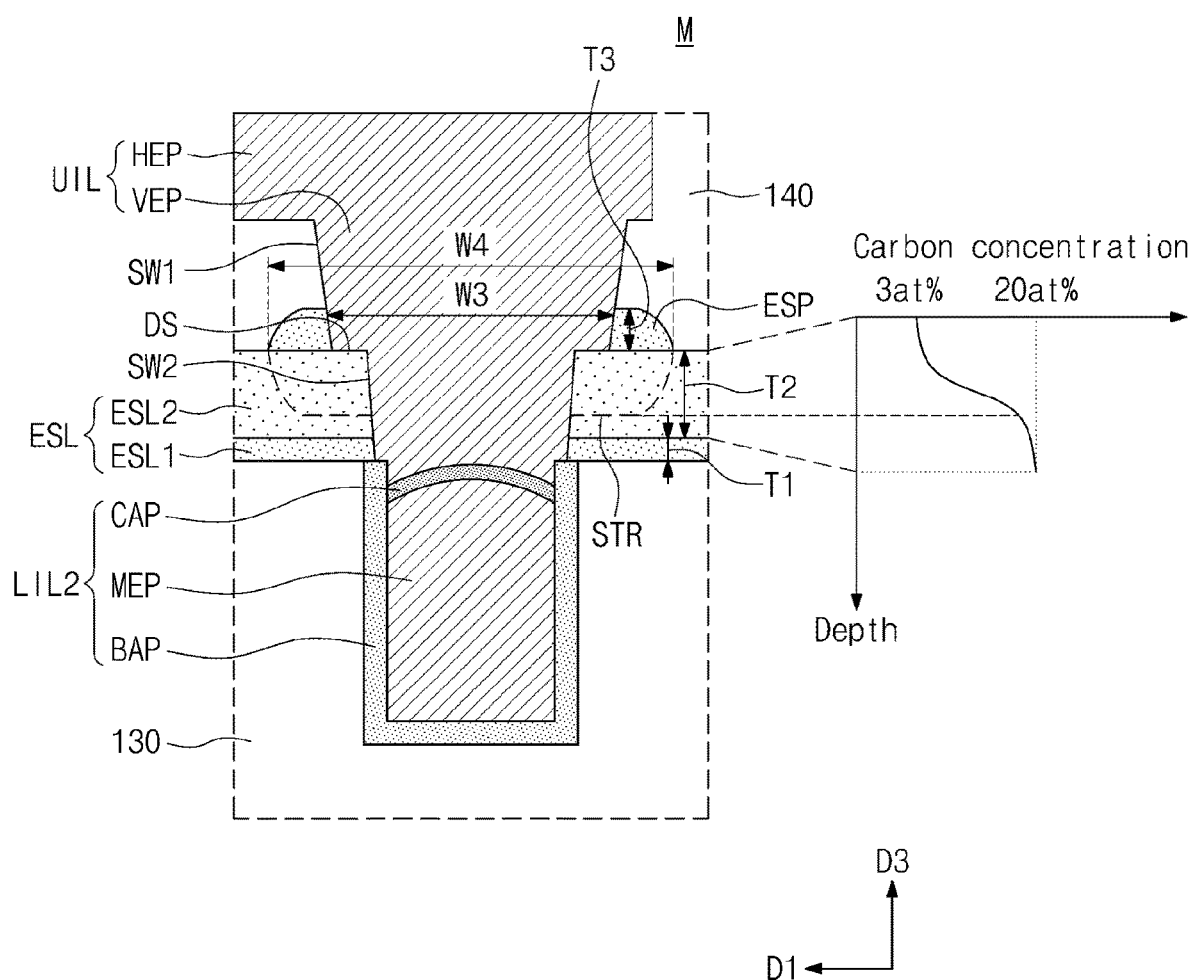
FIG. 3 is an enlarged cross-sectional view of a region 'M' of FIG. 2D.

FIGS. 12 to 17 are enlarged cross-sectional views of the region 'M' of FIG. 2D to illustrate a method of forming an upper interconnection line according to some embodiments of the inventive concepts. Hereinafter, a method of forming the upper interconnection line UIL according to the inventive concepts will be described in detail with reference to FIGS. 12 to 17.

Figure 12:
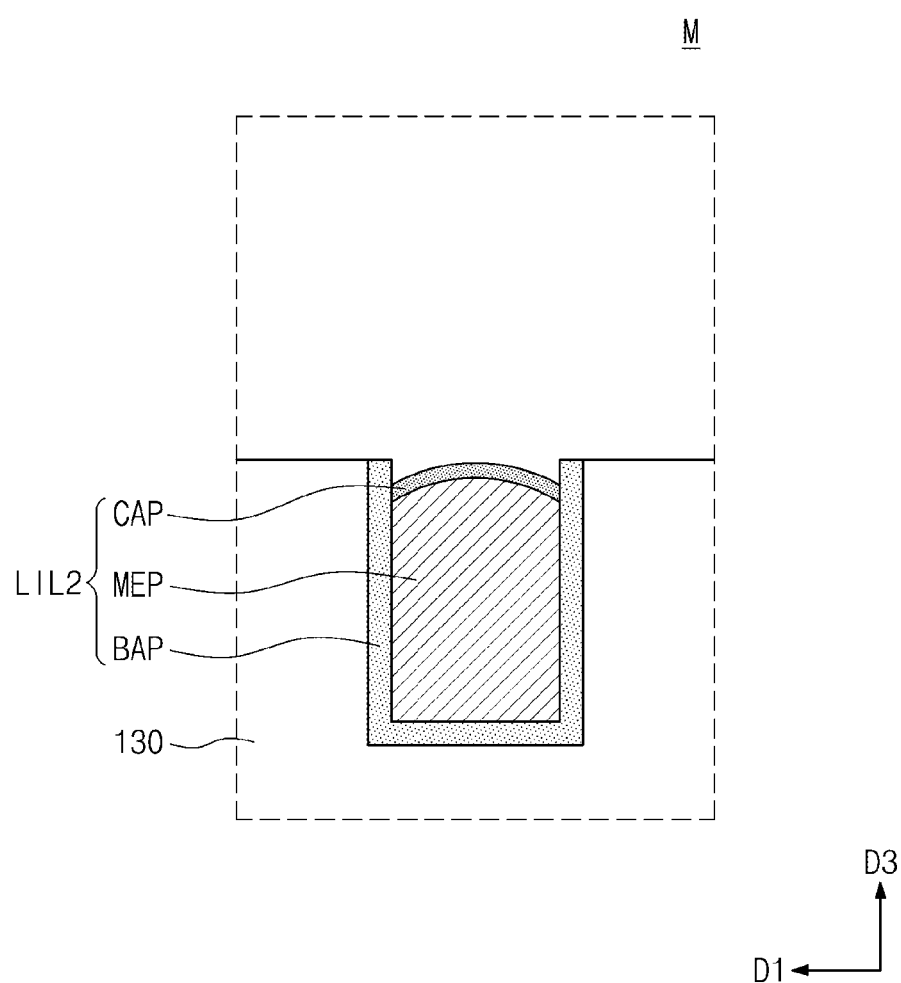
FIGS. 12, 13, 14, 15, 16, and 17 are enlarged cross-sectional views of the region 'M' of FIG. 2D to illustrate a method of forming an upper interconnection line according to some embodiments of the inventive concepts.

Referring to FIG. 12, the second lower interconnection line LIL2 may be formed in an upper portion of the third interlayer insulating layer 130. For example, the second lower interconnection line LIL2 may be formed by a single damascene process. The second lower interconnection line LIL2 may be formed by sequentially forming a metal pattern MEP and a metal capping pattern CAP on a barrier metal pattern BAP.

Figure 13:
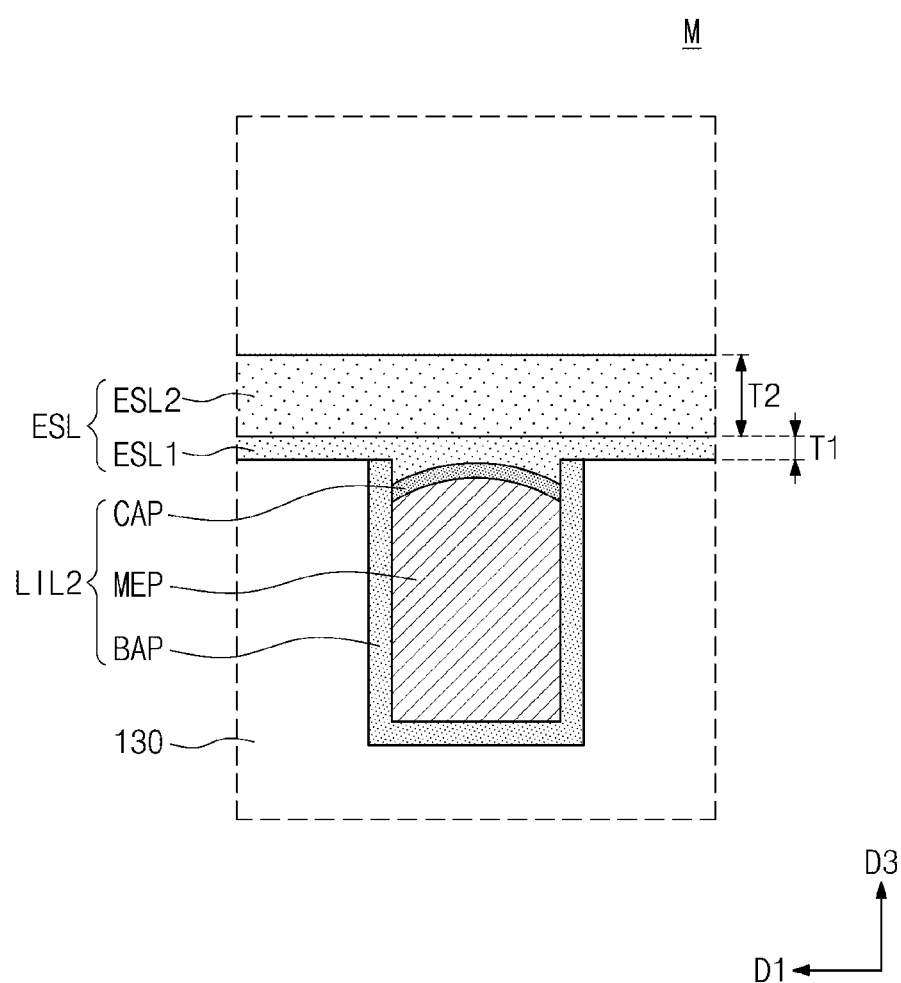

Referring to FIG. 13, a first etch stop layer ESL1 may be formed to cover a top surface of the third interlayer insulating layer 130 and a top surface of the second lower interconnection line LIL2. The first etch stop layer ESL1 may be formed with a thickness T1 of about 2 nm to about 5 nm. The first etch stop layer ESL1 may be formed of a material having high-k dielectric and low-density properties. The first etch stop layer ESL1 may include a metal oxide containing at least one metal selected from Al, Zr, Y, Hf, or Mo.

A second etch stop layer ESL2 may be formed on the first etch stop layer ESL1. The second etch stop layer ESL2 may be formed with a thickness T2 of about 3 nm to about 10 nm. The thickness T2 of the second etch stop layer ESL2 may be greater than the thickness T1 of the first etch stop layer ESL1. The second etch stop layer ESL2 may be formed of a material having low-k dielectric and high-density properties. The second etch stop layer ESL2 may contain X, Y, and carbon (C). Here, the 'X' may be an element selected from Si, Ge, Al, Zr, Y, Hf, or Mo, and the 'Y' may be O or N. For example, the second etch stop layer ESL2 may include SiOC, SiNC, GeOC, or GeNC. A content of carbon (C) in the second etch stop layer ESL2 may range from about 10 at % to about 25 at % (in particular, from about 15 at % to about 20 at %).

Figure 14:
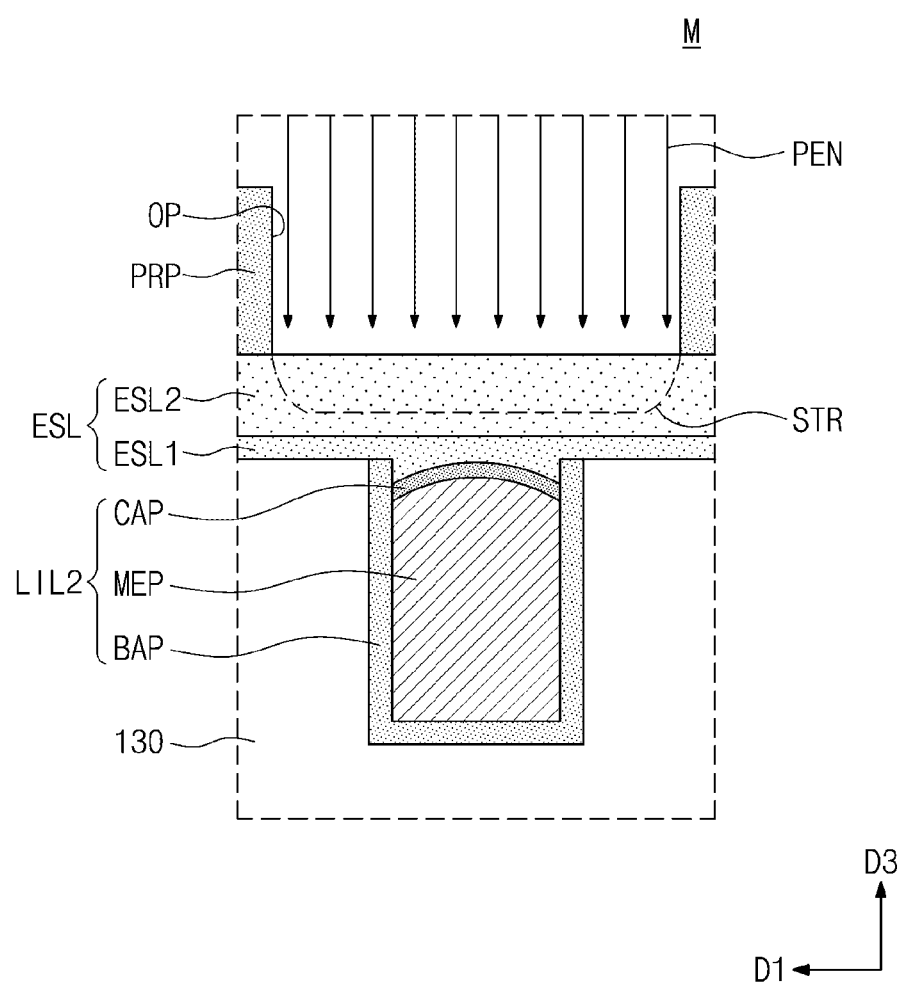

Referring to FIG. 14, a mask pattern PRP having an opening OP may be formed on the second etch stop layer ESL2. The opening OP of the mask pattern PRP may expose a partial region of the second etch stop layer ESL2. For example, the mask pattern PRP may include a photoresist pattern formed by a photolithography process.

Photon energy PEN may be applied to a surface of the second etch stop layer ESL2 exposed by the opening OP. For example, the photon energy PEN may be extreme ultraviolet (EUV) light. The exposed portion of the second etch stop layer ESL2 may be treated by the photon energy PEN, thereby forming a surface treatment region STR overlapping with the opening OP.

When the photon energy PEN is applied to the second etch stop layer ESL2, X—C bonds, Y—C bonds and C—C bonds in the second etch stop layer ESL2 may be broken to generate a carbon-containing gas as a by-product. In other words, the photon energy PEN may reduce a content of carbon (C) in the second etch stop layer ESL2.

The photon energy PEN may be applied in such a way that a content of carbon in the surface treatment region STR ranges from about 1 at % to about 5 at %. For example, the content of carbon in the surface treatment region STR may range from about 1 at % to about 5 at % (particularly, may be less than about 3 at %) by adjusting power, an irradiation time and/or an irradiation number of the EUV light.

Since the photon energy PEN is not applied to the second etch stop layer ESL2 covered by the mask pattern PRP, a content of carbon therein may not be changed. In other words, the content of carbon in the second etch stop layer ESL2 covered by the mask pattern PRP may be maintained in the range of about 10 at % to about 25 at %, and the content of carbon in the surface treatment region STR exposed by the mask pattern PRP may be reduced to a range of from about 1 at % to about 5 at %.

A surface of the second etch stop layer ESL2 may be hydrophobic. However, since the content of carbon in the surface treatment region STR is reduced, a surface of the surface treatment region STR may be hydrophilic.

Figure 15:
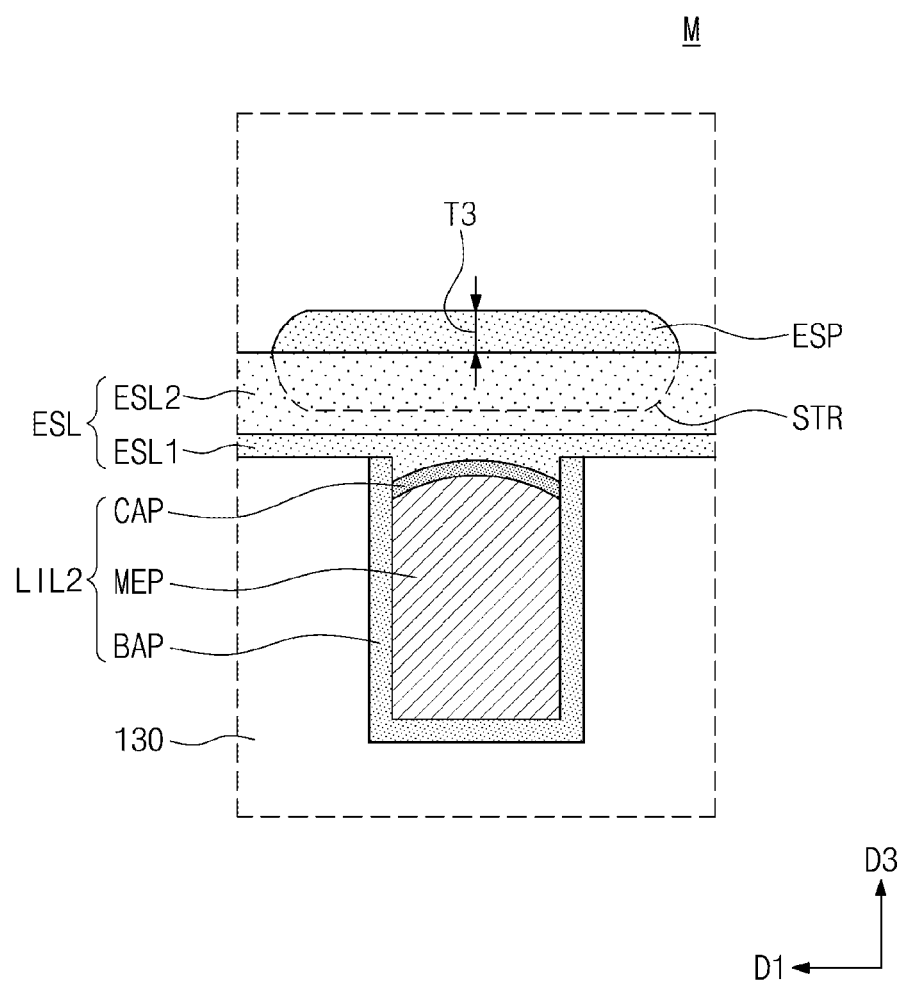

Referring to FIG. 15, the mask pattern PRP may be selectively removed. An etch stop pattern ESP may be selectively formed on the surface treatment region STR of the second etch stop layer ESL2. In other words, the etch stop pattern ESP may not be formed on another region(s) of the second etch stop layer ESL2 except or different than the surface treatment region STR.

Since the surface of the second etch stop layer ESL2 is hydrophobic but the surface of the surface treatment region STR is hydrophilic as described above, the etch stop pattern ESP may be selectively formed using a material of which a deposition rate is higher on a hydrophilic surface than on a hydrophobic surface.

The etch stop pattern ESP may be formed with a thickness T3 of about 2 nm to about 5 nm. The etch stop pattern ESP may be formed of a material having high-k dielectric and low-density properties. The etch stop pattern ESP may include a metal oxide containing at least one metal selected from Al, Zr, Y, Hf, or Mo.

For example, aluminum oxide (AlO) may have a high deposition rate on a silicon oxide (SiO) surface but may have a low deposition rate on a silicon carbide (SiC) surface. When a deposition cycle of AlO and an etch cycle of AlO are performed, AlO may be deposited on the surface treatment region STR having the SiO surface but may not be deposited on the other region(s) of the second etch stop layer ESL2 except or different than the surface treatment region STR.

According to embodiments of the inventive concepts, the etch stop pattern ESP may be selectively formed using a relatively simple exposure process without an inhibitor or other constraints for selectively forming the etch stop pattern ESP. Thus, the selective formation of the etch stop pattern ESP may be effectively performed using simple or low complexity processes.

The first etch stop layer ESL1, the second etch stop layer ESL2 and the etch stop pattern ESP may function as a triple etch stop layer having a three-layer structure. The triple etch stop layer may provide a high etch selectivity.

Figure 16:
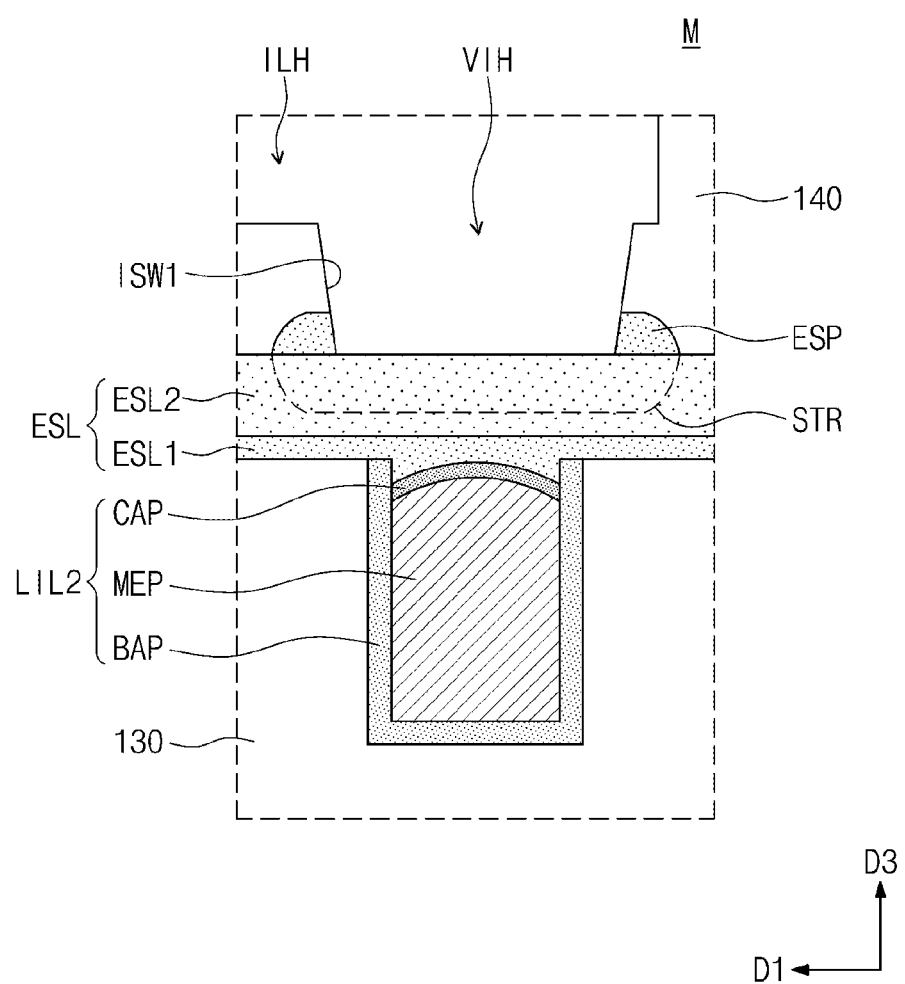

Referring to FIG. 16, the fourth interlayer insulating layer 140 may be formed on the second etch stop layer ESL2 and the etch stop pattern ESP. An interconnection line hole ILH defining the upper interconnection line UIL may be formed in an upper portion of the fourth interlayer insulating layer 140. The interconnection line hole ILH may be formed at a higher level than the etch stop pattern ESP.

A first etching process may be performed on a partial region of the interconnection line hole ILH to form a via hole VIH. The via hole VIH may be formed in a region vertically overlapping with the second lower interconnection line LIL2. The first etching process may be performed until the via hole VIH penetrates the etch stop pattern ESP to expose the second etch stop layer ESL2. The via hole VIH may have a first inner sidewall ISW1 extending from the interconnection line hole ILH to a top surface of the second etch stop layer ESL2.

Figure 17:
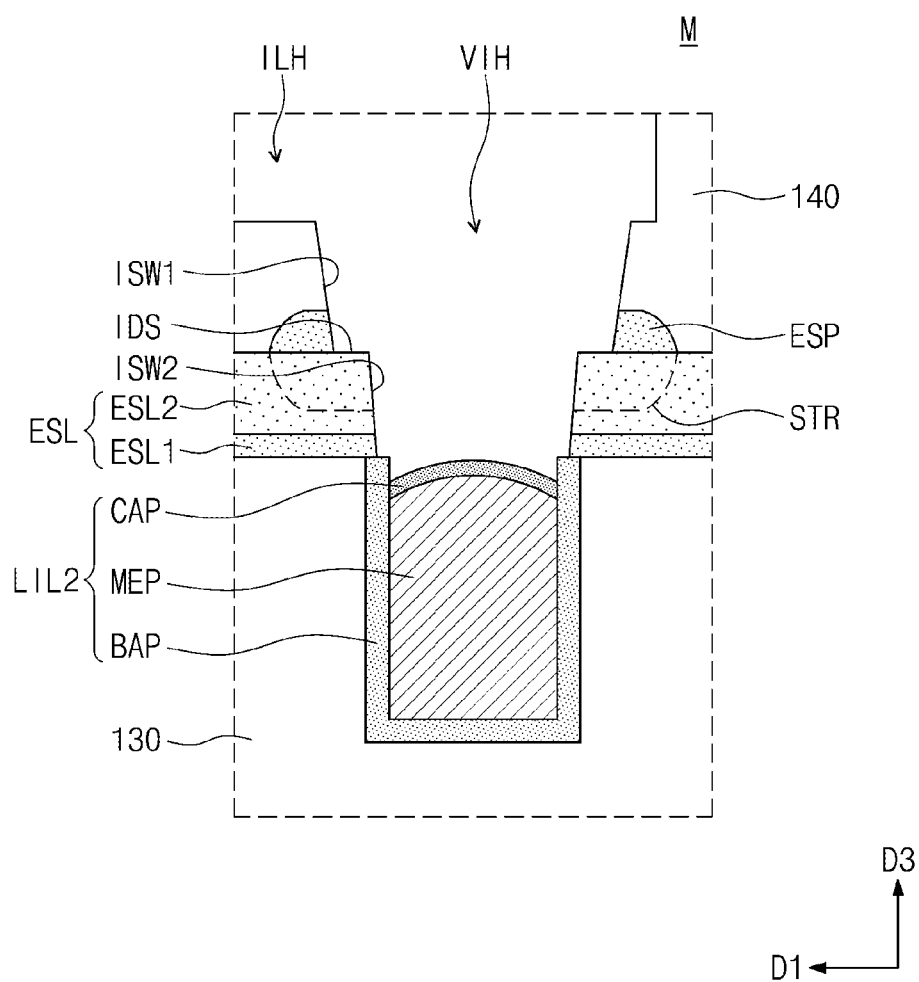

Referring to FIG. 17, a second etching process may be performed on the via hole VIH, and thus the via hole VIH may extend to a top surface of the second lower interconnection line LIL2. The second etching process may be performed until the via hole VIH penetrates the second etch stop layer ESL2 and the first etch stop layer ESL1 to expose the top surface of the second lower interconnection line LIL2.

The via hole VIH may have a second inner sidewall ISW2 extending from the top surface of the second etch stop layer ESL2 to the second lower interconnection line LIL2. A gradient of the second inner sidewall ISW2 may be the same as or different from a gradient of the first inner sidewall ISW1.

The via hole VIH may further have an inner intermediate surface IDS between the first inner sidewall ISW1 and the second inner sidewall ISW2. A gradient of the inner intermediate surface IDS may be gentler or less steep than the gradient of each of the first and second inner sidewalls ISW1 and ISW2. The inner intermediate surface IDS may be formed because the first etching process is changed to the second etching process.

According to the embodiments of the inventive concepts, the triple etch stop layer may provide the high etch selectivity during the etching processes for forming the via hole VIH, and thus the via hole VIH may stably expose the top surface of the second lower interconnection line LIL2. In other words, it is possible to prevent a process defect in which the via hole VIH does not expose the second lower interconnection line LIL2 or a process defect in which the second lower interconnection line LIL2 and its surrounding region are over-etched by the etching process for forming the via hole VIH.

Referring again to FIG. 3, the upper interconnection line UIL may be formed by filling the interconnection line hole ILH and the via hole VIH with a conductive material. While not shown in the drawings, the formation of the upper interconnection line UIL may include forming a barrier layer in the interconnection line hole ILH and the via hole VIH, and forming a metal layer on the barrier layer.

Figure 18:
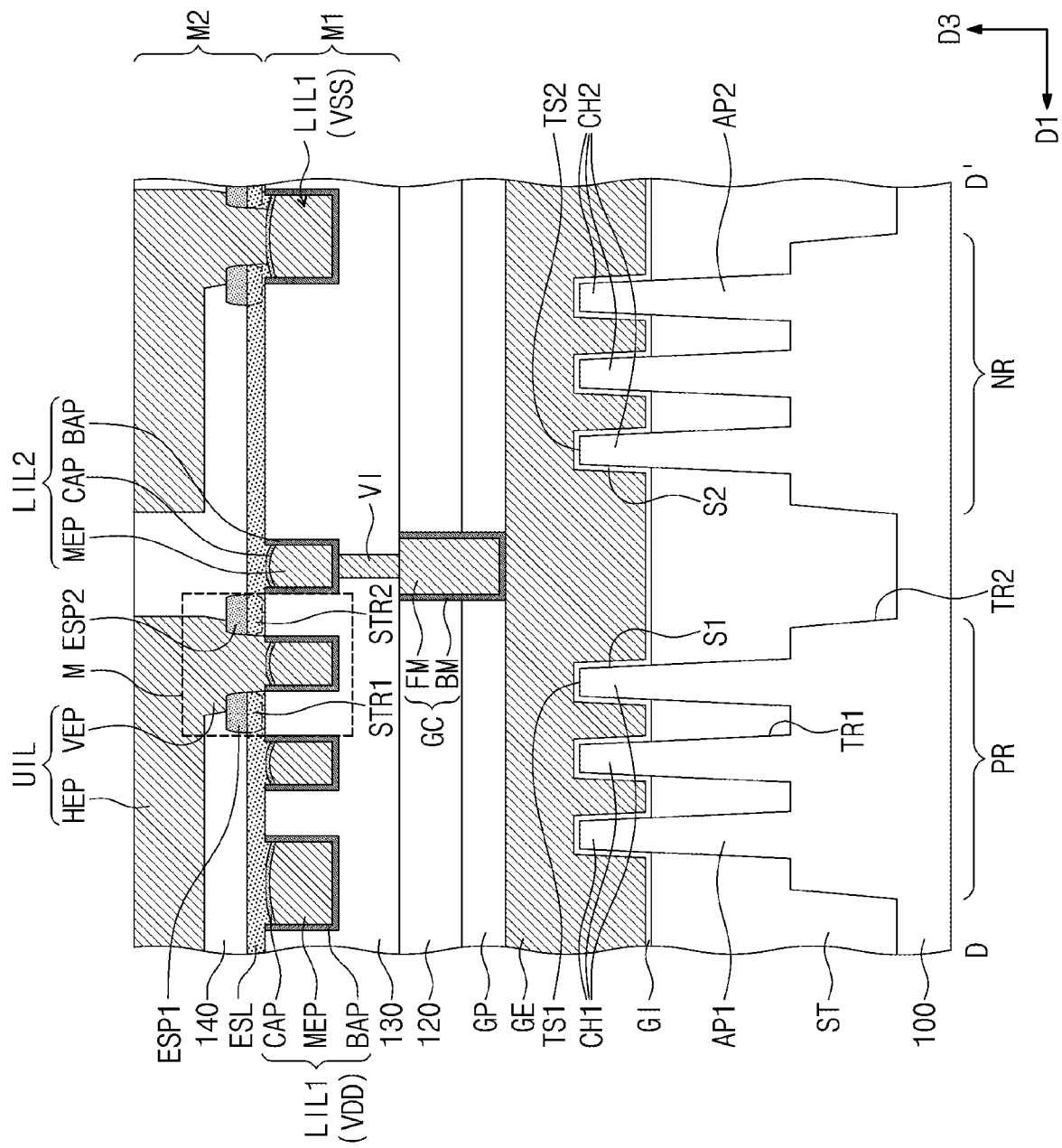
FIG. 18 is a cross-sectional view taken along the line D-D' of FIG. 1 to illustrate a semiconductor device according to some embodiments of the inventive concepts.
Figure 19:
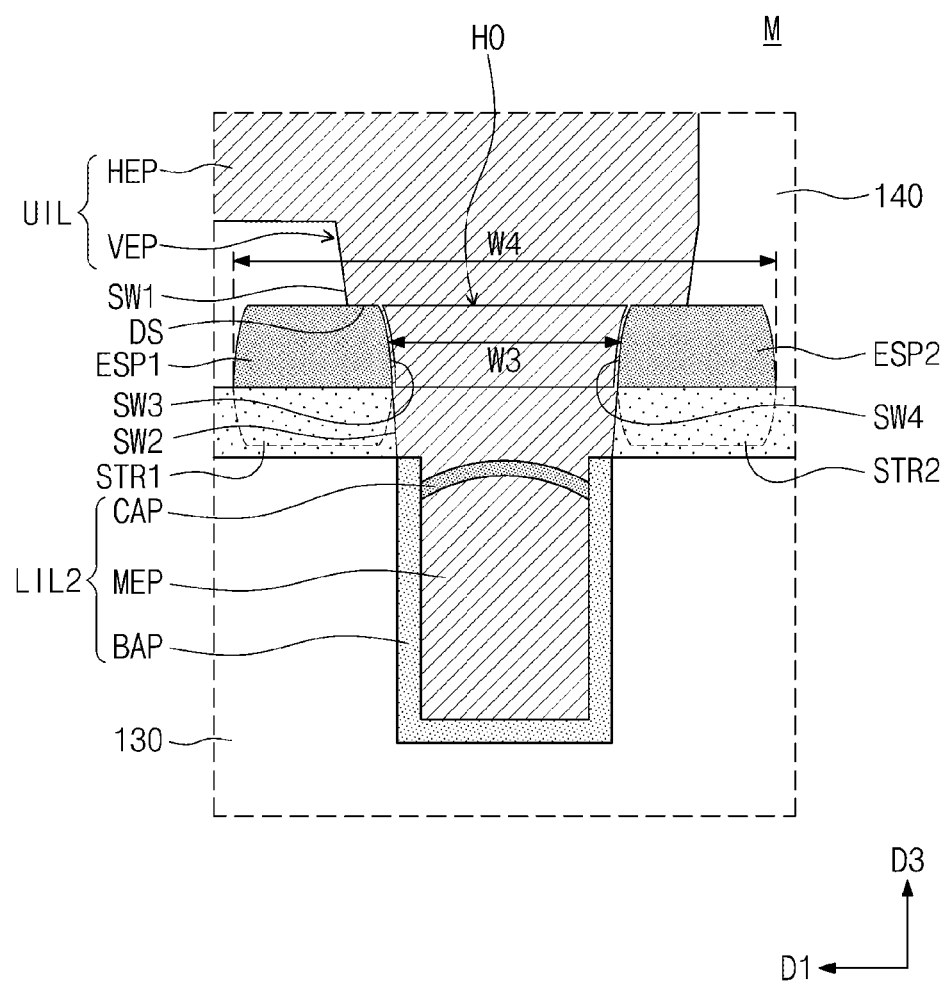
FIG. 19 is an enlarged cross-sectional view of a region 'M' of FIG. 18.

FIG. 18 is a cross-sectional view taken along the line D-D' of FIG. 1 to illustrate a semiconductor device according to some embodiments of the inventive concepts. FIG. 19 is an enlarged cross-sectional view of a region 'M' of FIG. 18. In the present embodiments, the descriptions to the same technical features as in the embodiments of FIGS. 1, 2A to 2D and 3 will be omitted for the purpose of ease and convenience in explanation. In other words, differences between the present embodiments and the embodiments of FIGS. 1, 2A to 2D and 3 will be mainly described hereinafter.

Referring to FIGS. 18 and 19, an etch stop layer ESL according to the present embodiments may be formed of a single layer, in contrast to the etch stop layer ESL including the first and second etch stop layers ESL1 and ESL2 in FIG. 3.

The etch stop layer ESL may be a low-k dielectric layer containing carbon (C). For example, the etch stop layer ESL may include SiOC, SiNC, GeOC, or GeNC. The etch stop layer ESL may be substantially the same as the second etch stop layer ESL2 described above.

The etch stop layer ESL may include a first surface treatment region STR1 and a second surface treatment region STR2, which are adjacent to each other. The first and second surface treatment regions STR1 and STR2 may be adjacent to both or opposing sides of the second lower interconnection line LIL2, respectively.

A first etch stop pattern ESP1 and a second etch stop pattern ESP2 may be provided on the first surface treatment region STR1 and the second surface treatment region STR2, respectively. The first and second etch stop patterns ESP1 and ESP2 may vertically overlap with the first and second surface treatment regions STR1 and STR2, respectively. The first and second etch stop patterns ESP1 and ESP2 may be substantially the same as the etch stop pattern ESP described above.

The first etch stop pattern ESP1 may have a third sidewall SW3 facing the second etch stop pattern ESP2, and the second etch stop pattern ESP2 may have a fourth sidewall SW4 facing the first etch stop pattern ESP1. A groove HO may be defined between the third sidewall SW3 and the fourth sidewall SW4. The groove HO may vertically overlap with the second lower interconnection line LIL2.

The via portion VEP of the upper interconnection line UIL may be aligned by the first and second etch stop patterns ESP1 and ESP2 and thus may be in contact with the top surface of the second lower interconnection line LIL2. More particularly, the via portion VEP may be provided in the groove HO and may extend downward along the third and fourth sidewalls SW3 and SW4. The via portion VEP may penetrate the etch stop layer ESL under the groove HO so as to be electrically connected to the second lower interconnection line LIL2.

The intermediate surface DS of the via portion VEP may be in contact with a top surface of at least one of the first and second etch stop patterns ESP1 and ESP2. In other words, the via portion VEP may extend downward from the top surface of each of the first and second etch stop patterns ESP1 and ESP2 along the sidewall thereof. The first and second etch stop patterns ESP1 and ESP2 may guide the via portion VEP in such a way that the via portion VEP is not electrically connected to another interconnection line adjacent thereto but is electrically connected to only the second lower interconnection line LIL2 corresponding to a target or as intended.

The via portion VEP filling the groove HO may have a third width W3 in the first direction D1. A maximum width of the etch stop pattern ESP1 and ESP2 in the first direction D1 (i.e., a maximum width between outer sidewalls of the first and second etch stop patterns ESP1 and ESP2) may be a fourth width W4. The fourth width W4 may range from about 1.2 about times to 3 times the third width W3.

According to the embodiments of the inventive concepts, the first and second etch stop patterns ESP1 and ESP2 may prevent misalignment of the via portion VEP. The first and second etch stop patterns ESP1 and ESP2 may prevent occurrence of an electrical short between the via portion VEP and another lower interconnection line adjacent thereto. As a result, the first and second etch stop patterns ESP1 and ESP2 may prevent process defects (e.g., the misalignment and the electrical short of the via portion VEP) to improve reliability of the device.

In addition, according to the embodiments of the inventive concepts, the first and second etch stop patterns ESP1 and ESP2 may include a high-k dielectric material. However, the first and second etch stop patterns ESP1 and ESP2 may be selectively provided on only the first and second surface treatment regions STR1 and STR2 of the etch stop layer ESL, respectively, and thus the first and second etch stop patterns ESP1 and ESP2 may have reduced or minimum volumes capable of guiding the via portion VEP. Since the respective sizes or volumes of the first and second etch stop patterns ESP1 and ESP2 are reduced or minimized, a capacitance between the first and second metal layers M1 and M2 may be reduced to improve performance of the device.

Figure 20:
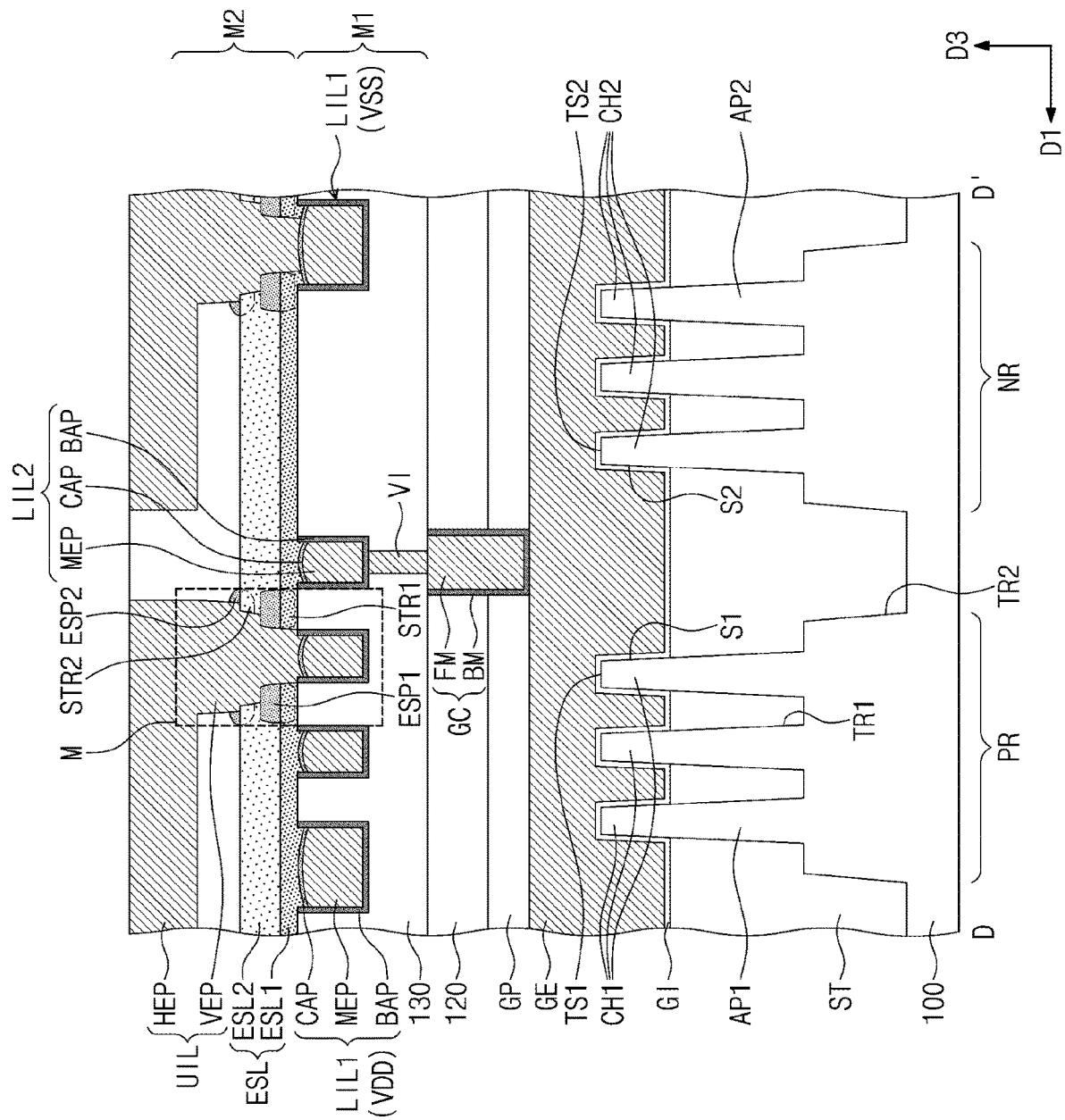
FIG. 20 is a cross-sectional view taken along the line D-D' of FIG. 1 to illustrate a semiconductor device according to some embodiments of the inventive concepts.
Figure 21:
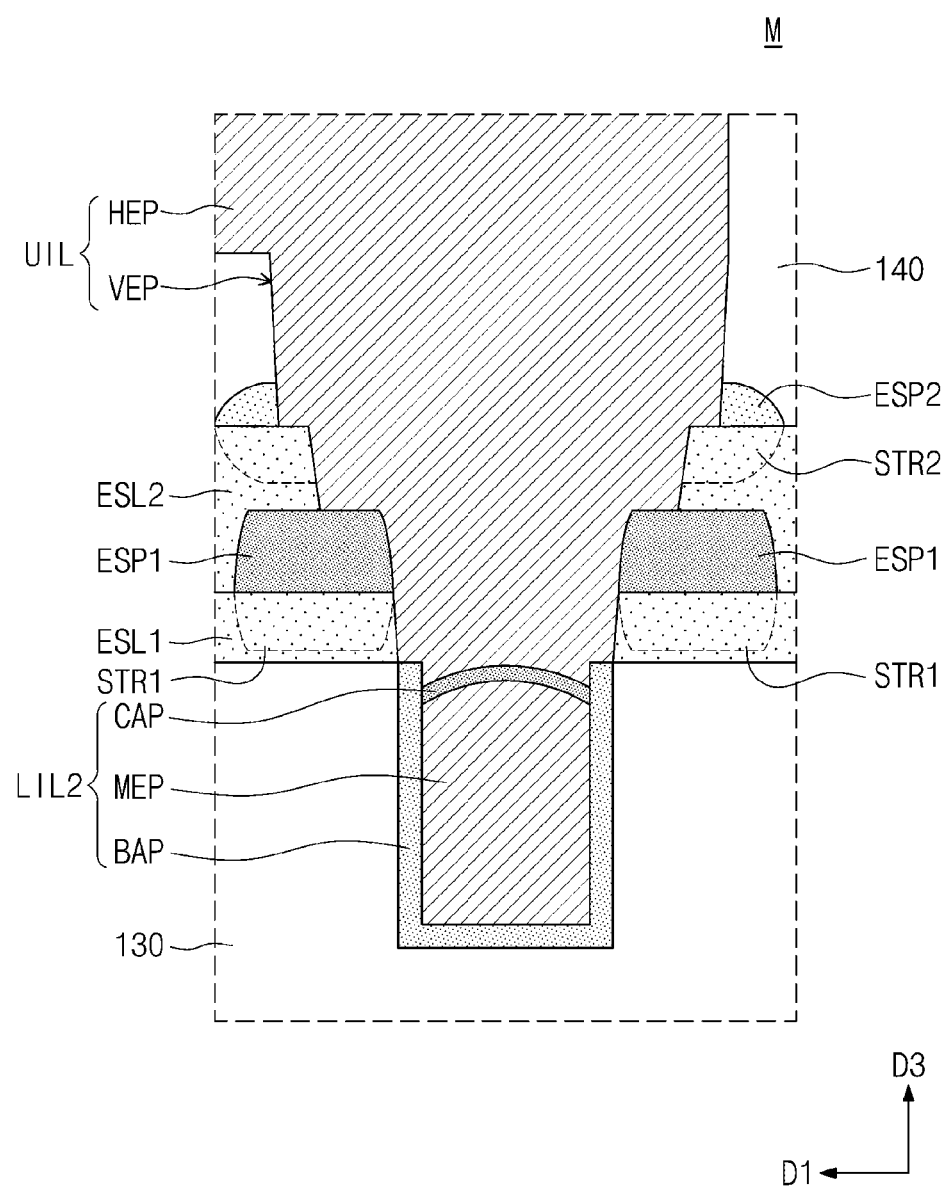
FIG. 21 is an enlarged cross-sectional view of a region 'M' of FIG. 20.

FIG. 20 is a cross-sectional view taken along the line D-D' of FIG. 1 to illustrate a semiconductor device according to some embodiments of the inventive concepts. FIG. 21 is an enlarged cross-sectional view of a region 'M' of FIG. 20. In the present embodiments, the descriptions to the same technical features as in the embodiments of FIGS. 1, 2A to 2D, 3, 18 and 19 will be omitted for the purpose of ease and convenience in explanation. In other words, differences between the present embodiments and the embodiments of FIGS. 1, 2A to 2D, 3, 18 and 19 will be mainly described hereinafter.

Referring to FIGS. 20 and 21, a first etch stop layer ESL1 may be provided on the third interlayer insulating layer 130. The first etch stop layer ESL1 may be substantially the same as the etch stop layer ESL described above with reference to FIG. 19.

The first etch stop layer ESL1 may include a pair of first surface treatment regions STR1. The pair of first surface treatment regions STR1 may be substantially the same as the first and second surface treatment regions STR1 and STR2 described above with reference to FIG. 19. A pair of first etch stop patterns ESP1 may be provided on the pair of first surface treatment regions STR1, respectively. The pair of first etch stop patterns ESP1 may be substantially the same as the first and second etch stop patterns ESP1 and ESP2 described above with reference to FIG. 19.

A second etch stop layer ESL2 may be provided on the first etch stop layer ESL1 and the first etch stop patterns ESP1. The second etch stop layer ESL2 may be substantially the same as the second etch stop layer ESL2 described above with reference to FIG. 3.

The second etch stop layer ESL2 may include a second surface treatment region STR2. The second surface treatment region STR2 may be substantially the same as the surface treatment region STR described above with reference to FIG. 3. A second etch stop pattern ESP2 may be provided on the second surface treatment region STR2. The second etch stop pattern ESP2 may be substantially the same as the etch stop pattern ESP described above with reference to FIG. 3.

A maximum thickness of the first etch stop pattern ESP1 may be equal to or greater than a maximum thickness of the second etch stop pattern ESP2. The first and second etch stop patterns ESP1 and ESP2 may include the same material or may include different materials.

The second etch stop pattern ESP2 and the second etch stop layer ESL2 of the present embodiments may provide a high etch selectivity, like the etch stop pattern ESP and the etch stop layer ESL of FIG. 3. The pair of first etch stop patterns ESP1 of the present embodiments may guide the via portion VEP to the second lower interconnection line LIL2 corresponding to a target, like the first and second etch stop patterns ESP1 and ESP2 of FIG. 19.

As a result, according to the present embodiments, it is possible to reduce or prevent a process defect in which the via portion VEP is not electrically connected to the second lower interconnection line LIL2 and a process defect in which the via portion VEP is electrically connected to another interconnection line adjacent to but different than the intended second lower interconnection line LIL2. Thus, reliability and electrical characteristics of the semiconductor device may be improved.

FIGS. 22A, 22B, 22C and 22D are cross-sectional views taken along the lines A-A', B-B', C-C' and D-D' of FIG. 1, respectively, to illustrate a semiconductor device according to some embodiments of the inventive concepts. In the present embodiments, the descriptions to the same technical features as in the embodiments of FIGS. 1 and 2A to 2D will be omitted for the purpose of ease and convenience in explanation. In other words, differences between the present embodiments and the embodiments of FIGS. 1 and 2A to 2D will be mainly described hereinafter.

Referring to FIGS. 1 and 22A to 22D, a substrate 100 including a first active region PR and a second active region NR may be provided. A device isolation layer ST may be provided on the substrate 100. The device isolation layer ST may define a first active pattern AP1 and a second active pattern AP2 in an upper portion of the substrate 100. The first active pattern AP1 and the second active pattern AP2 may be defined on the first active region PR and the second active region NR, respectively.

The first active pattern AP1 may include first channel patterns CH1 which are vertically stacked. The stacked first channel patterns CH1 may be spaced apart from each other in the third direction D3. The stacked first channel patterns CH1 may vertically overlap with each other. The second active pattern AP2 may include second channel patterns CH2 which are vertically stacked. The stacked second channel patterns CH2 may be spaced apart from each other in the third direction D3. The stacked second channel patterns CH2 may vertically overlap with each other. The first and second channel patterns CH1 and CH2 may include at least one of silicon (Si), germanium (Ge), or silicon-germanium (SiGe).

The first active pattern AP1 may further include first source/drain patterns SD1. The stacked first channel patterns CH1 may be disposed between a pair of the first source/drain patterns SD1 adjacent to each other. The stacked first channel patterns CH1 may connect the pair of first source/drain patterns SD1 adjacent to each other.

The second active pattern AP2 may further include second source/drain patterns SD2. The stacked second channel patterns CH2 may be disposed between a pair of the second source/drain patterns SD2 adjacent to each other. The stacked second channel patterns CH2 may connect the pair of second source/drain patterns SD2 adjacent to each other.

Gate electrodes GE may extend in the first direction D1 to intersect the first and second channel patterns CH1 and CH2. The gate electrode GE may vertically overlap with the first and second channel patterns CH1 and CH2. A pair of gate spacers GS may be disposed on both (e.g., opposing) sidewalls of the gate electrode GE, respectively. A gate capping pattern GP may be provided on the gate electrode GE.

Figure 22A:
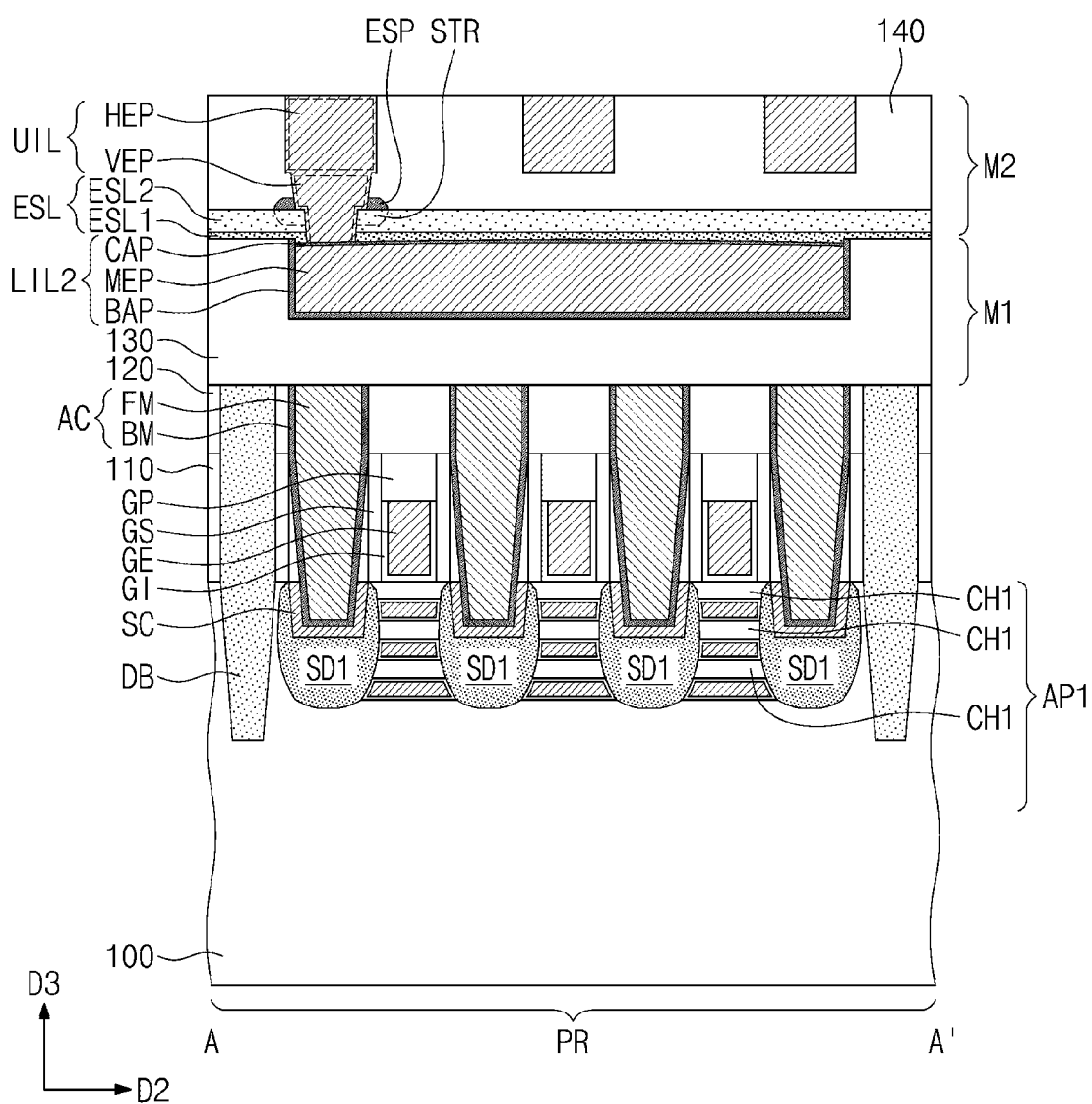
FIGS. 22A, 22B, 22C and 22D are cross-sectional views taken along the lines A-A', B-B', C-C' and D-D' of FIG. 1, respectively, to illustrate a semiconductor device according to some embodiments of the inventive concepts.
Figure 22B:
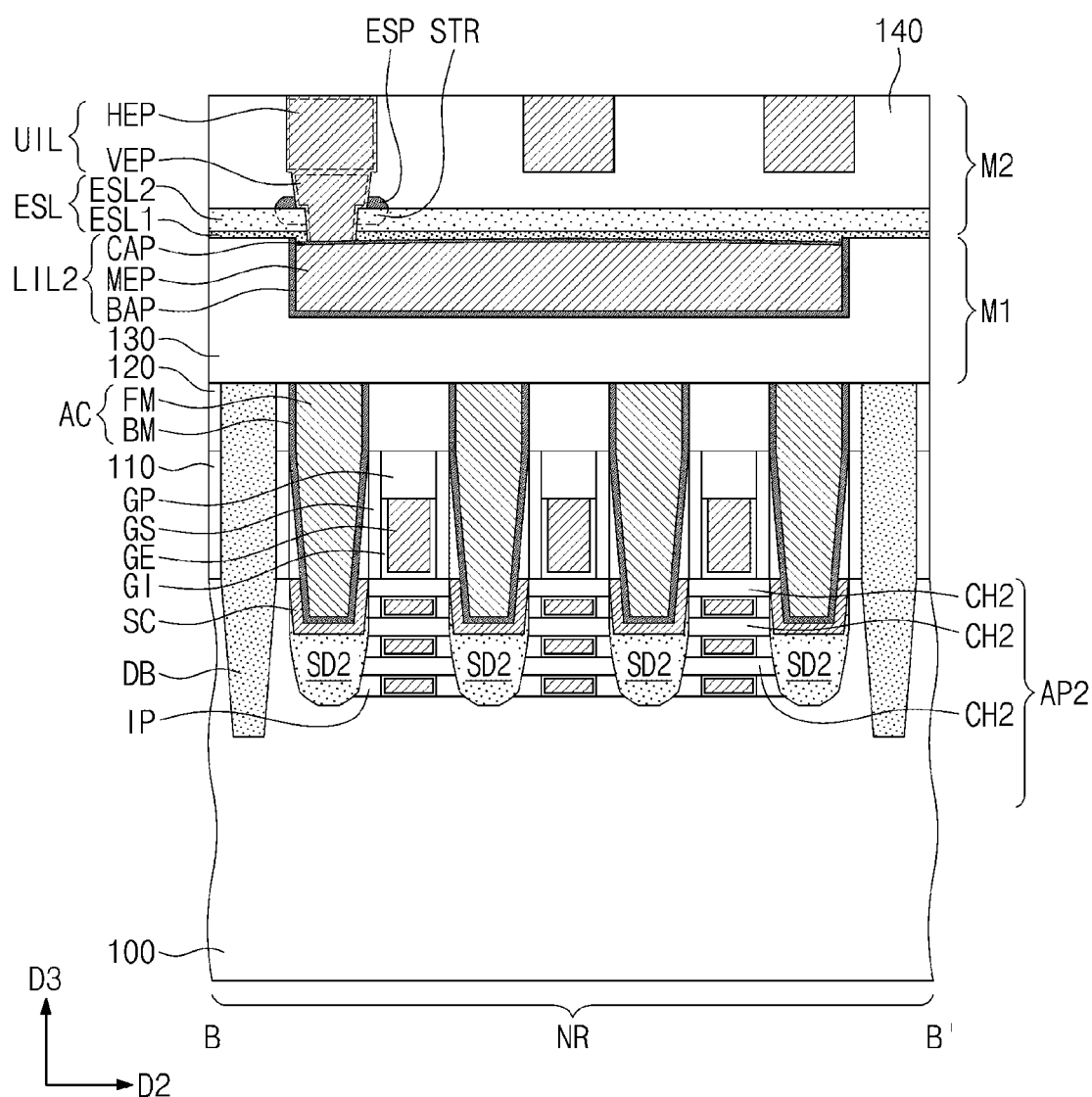
Figure 22C:
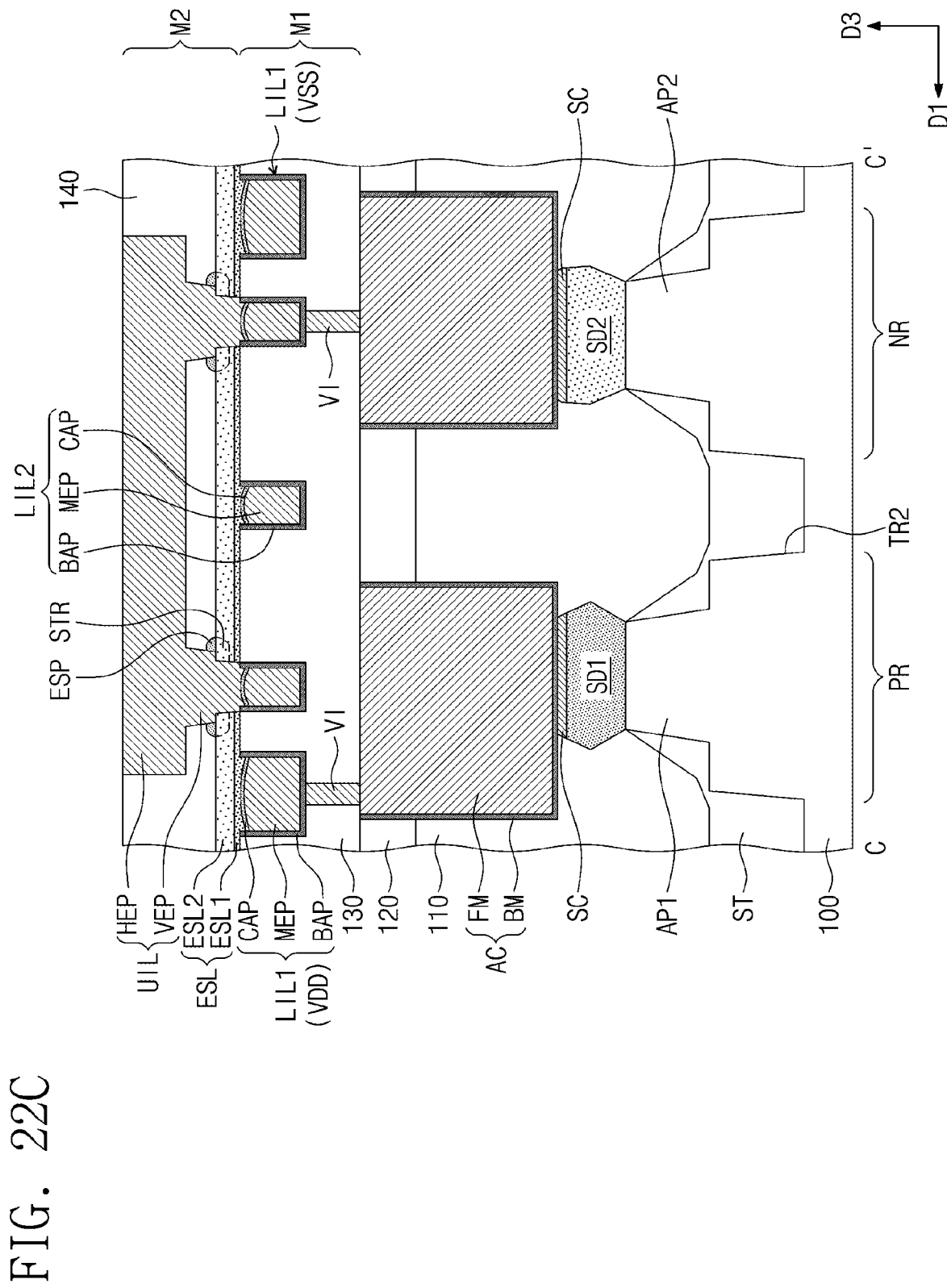
Figure 22D:
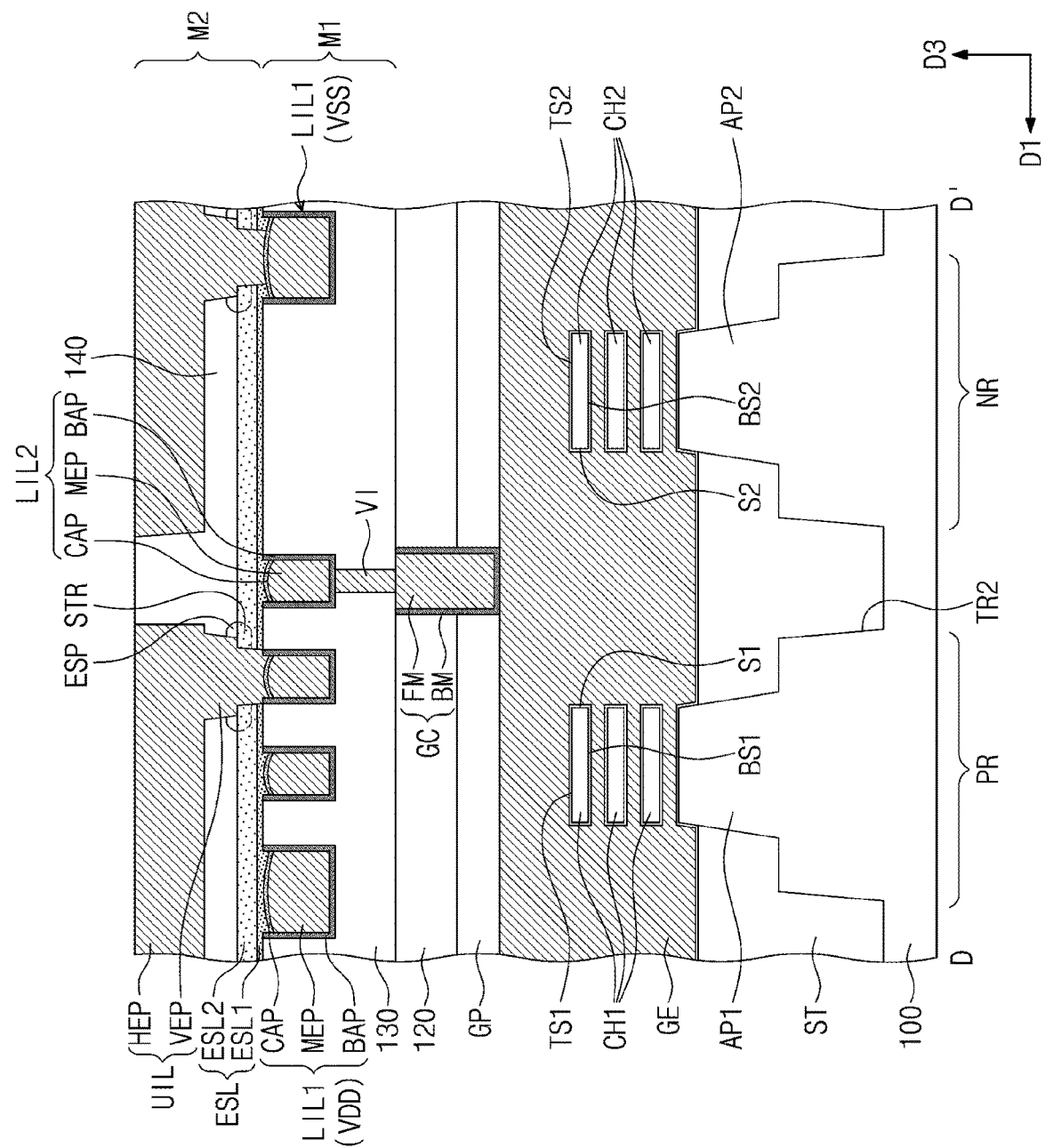

The gate electrode GE may surround each of the first and second channel patterns CH1 and CH2 (see FIG. 22D). The gate electrode GE may be provided on a first top surface TS1, at least one first sidewall S1 and a first bottom surface BS1 of the first channel pattern CH1. The gate electrode GE may be provided on a second top surface TS2, at least one second sidewall S2 and a second bottom surface BS2 of the second channel pattern CH2. In other words, the gate electrode GE may surround the top surface, the bottom surface and both (e.g., opposing) sidewalls of each of the first and second channel patterns CH1 and CH2. Transistors according to the present embodiments may be 3D field effect transistors (e.g., MBCFETs) in which the gate electrode GE three-dimensionally surrounds channels CH1 and CH2.

A gate dielectric pattern GI may be provided between the gate electrode GE and each of the first and second channel patterns CH1 and CH2. The gate dielectric pattern GI may surround each of the first and second channel patterns CH1 and CH2.

An insulating pattern IP may be disposed between the gate dielectric pattern GI and the second source/drain pattern SD2 on the second active region NR. The gate electrode GE may be spaced apart from the second source/drain pattern SD2 by the gate dielectric pattern GI and the insulating pattern IP. The insulating pattern IP may be omitted on the first active region PR in some embodiments.

A first interlayer insulating layer 110 and a second interlayer insulating layer 120 may be provided on an entire top surface of the substrate 100. Active contacts AC may penetrate the second and first interlayer insulating layers 120 and 110 so as to contact and be electrically connected to the first and second source/drain patterns SD1 and SD2. A gate contact GC may penetrate the second interlayer insulating layer 120 and the gate capping pattern GP so as to contact and be electrically connected to the gate electrode GE.

A third interlayer insulating layer 130 may be provided on the second interlayer insulating layer 120. A fourth interlayer insulating layer 140 may be provided on the third interlayer insulating layer 130. A first metal layer M1 may be provided in the third interlayer insulating layer 130. A second metal layer M2 may be provided in the fourth interlayer insulating layer 140. The first metal layer M1 and the second metal layer M2 may be substantially the same as described above with reference to FIGS. 1 and 2A to 2D.

Figure 23:
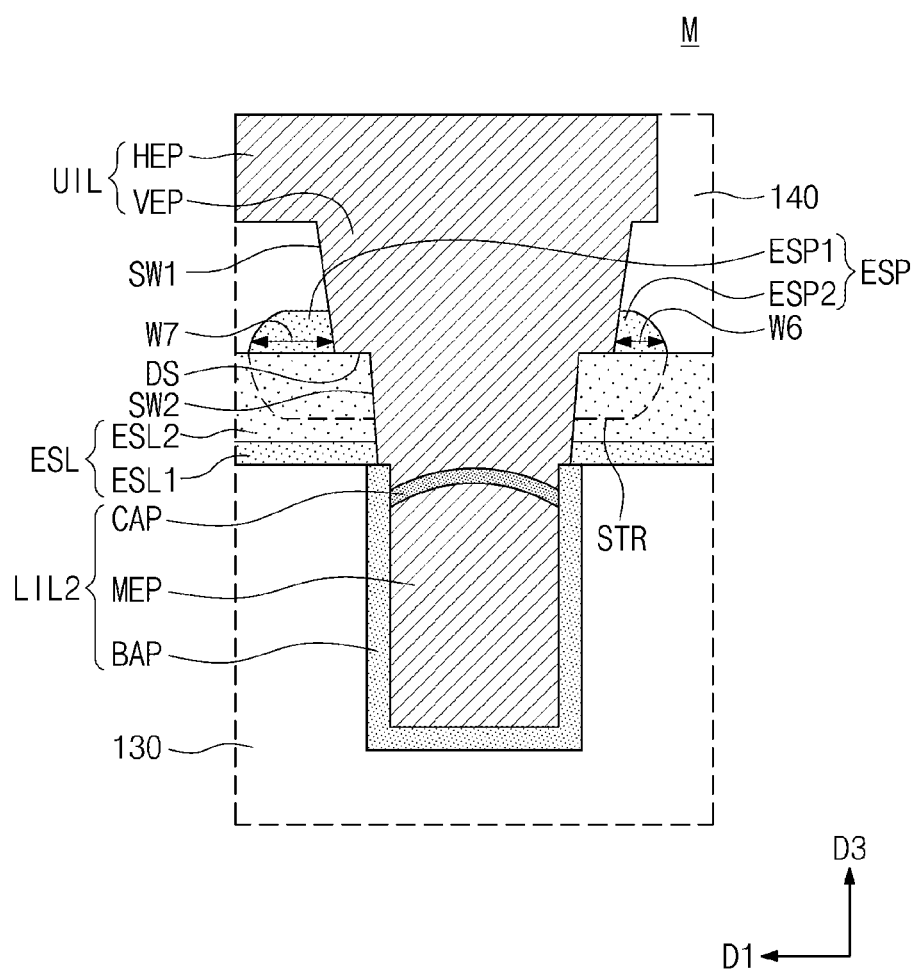
FIGS. 23, 24 and 25 are enlarged cross-sectional views of the region 'M' of FIG. 2D according to some embodiments of the inventive concepts.
Figure 24:
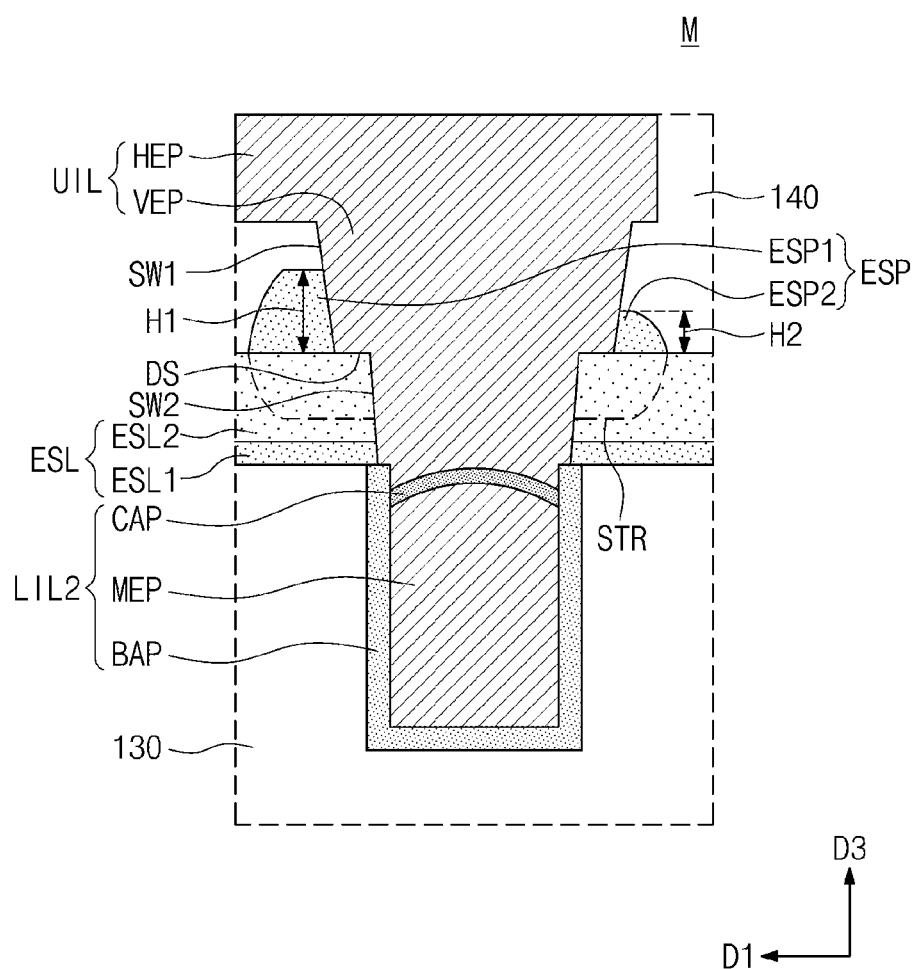
Figure 25:
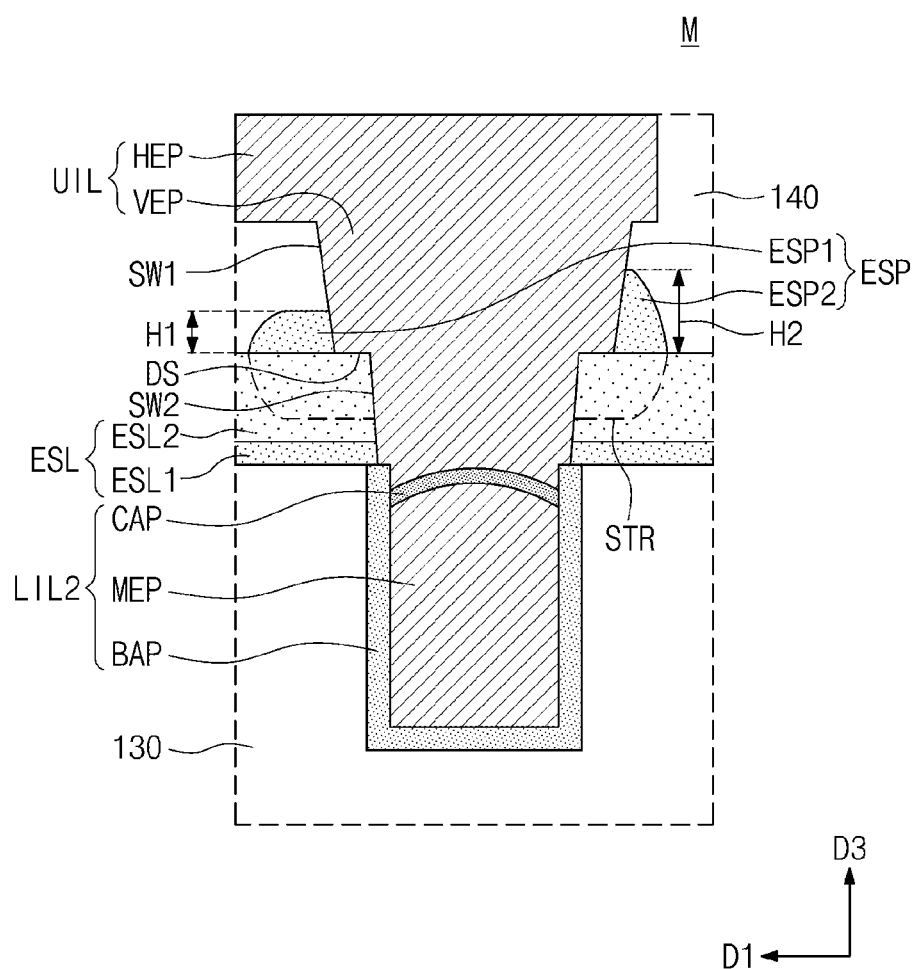

FIGS. 23, 24 and 25 are enlarged cross-sectional views of the region 'M' of FIG. 2D according to some embodiments of the inventive concepts. In the present embodiments, the descriptions to the same technical features as in the embodiments of FIGS. 1, 2A to 2D and 3 will be omitted for the purpose of ease and convenience in explanation. In other words, differences between the present embodiments and the embodiments of FIGS. 1, 2A to 2D and 3 will be mainly described hereinafter.

Referring to FIG. 23, an etch stop pattern ESP may include a first etch stop pattern ESP1 and a second etch stop pattern ESP2. The first and second etch stop patterns ESP1 and ESP2 may be portions of the etch stop pattern ESP, respectively.

The first etch stop pattern ESP1 may be in contact with the first sidewall SW1 of the via portion VEP of the upper interconnection line UIL. The second etch stop pattern ESP2 may be in contact with an opposite sidewall of the via portion VEP of the upper interconnection line UIL.

A maximum width of the first etch stop pattern ESP1 in the first direction D1 may be a seventh width W7. A maximum width of the second etch stop pattern ESP2 in the first direction D1 may be a sixth width W6. The seventh width W7 may be greater than the sixth width W6. In other words, a size of the first etch stop pattern ESP1 being in contact with one side of the via portion VEP may be different from or asymmetric with respect to a size of the second etch stop pattern ESP2 being in contact with another side of the via portion VEP.

Referring to FIGS. 24 and 25, a first etch stop pattern ESP1 and a second etch stop pattern ESP2 may have different heights from each other. For example, the first etch stop pattern ESP1 may have a first height H1 (i.e., a maximum height) from the top surface of the second etch stop layer ESL2. The second etch stop pattern ESP2 may have a second height H2 (i.e., a maximum height) from the top surface of the second etch stop layer ESL2. Referring to FIG. 24, the first height H1 may be greater than the second height H2. Referring to FIG. 25, the first height H1 may be less than the second height H2.

In the semiconductor device according to the inventive concepts, the etch stop pattern having a high dielectric constant may have a minimum volume capable of performing the function of the etch stop layer. Thus, the capacitance between the first and second metal layers may be reduced to improve the performance of the device. The etch stop pattern according to the inventive concepts may reduce or prevent a process defect in which a via of the upper interconnection line is not electrically connected to the lower interconnection line, and/or a process defect in which the via is electrically connected to another interconnection line adjacent to but different than the intended lower interconnection line. Thus, the reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a substrate including an active region;
   a device isolation layer defining an active pattern on the active region;
   a plurality of channel patterns that are vertically stacked on the active pattern and spaced apart from each other;
   a source/drain pattern on the active pattern, the source/drain pattern being connected to the plurality of channel patterns;
   a gate electrode on the plurality of channel patterns;
   a gate dielectric pattern between the gate electrode and each of the plurality of channel patterns;
   an active contact electrically connected to the source/drain pattern;
   a first metal layer in a first interlayer insulating layer that is on the active contact;
   a second metal layer in a second interlayer insulating layer that is on the first interlayer insulating layer;
   an etch stop layer between the first interlayer insulating layer and the second interlayer insulating layer; and
   an etch stop pattern on the etch stop layer,
   wherein the first metal layer includes a lower interconnection line electrically connected to the active contact,
   wherein the second metal layer includes an upper interconnection line electrically connected to the lower interconnection line,
   wherein the upper interconnection line includes a via portion penetrating the etch stop layer to contact the lower interconnection line,
   wherein the etch stop pattern is in contact with a first sidewall of the via portion,
   wherein the second interlayer insulating layer extends on the etch stop pattern and a top surface of the etch stop layer that is free of the etch stop pattern, and
   wherein a first dielectric constant of the etch stop pattern is higher than a second dielectric constant of the etch stop layer.

2. The semiconductor device of claim 1, wherein a maximum thickness of the etch stop pattern is less than a thickness of the etch stop layer.

3. The semiconductor device of claim 1, wherein the etch stop layer comprises a surface treatment region having the etch stop pattern thereon, and
   wherein a first concentration of carbon in the surface treatment region is lower than a second concentration of carbon in another region of the etch stop layer different than the surface treatment region.

4. The semiconductor device of claim 3, wherein a maximum width of the etch stop pattern is confined within a width of the surface treatment region.

5. The semiconductor device of claim 1, wherein the via portion further comprises:
   a second sidewall in contact with the etch stop layer; and
   an intermediate surface extending between the first sidewall and the second sidewall,
   wherein a gradient of the intermediate surface is less steep than a gradient of each of the first and second sidewalls.

6. The semiconductor device of claim 1, wherein the lower interconnection line comprises:
   a pair of first lower interconnection lines configured to receive a drain voltage (VDD) and a source voltage (VSS), respectively; and
   second lower interconnection lines arranged between the pair of first lower interconnection lines,
   wherein a logic cell is defined between the pair of first lower interconnection lines.

7. A semiconductor device comprising:
   a transistor on a substrate;
   a first interlayer insulating layer on the transistor;
   a lower interconnection line in an upper portion of the first interlayer insulating layer;
   an etch stop layer on the first interlayer insulating layer and the lower interconnection line;
   a second interlayer insulating layer on the etch stop layer;
   an upper interconnection line in the second interlayer insulating layer, the upper interconnection line comprising a via portion penetrating the etch stop layer to contact the lower interconnection line;
   a first etch stop pattern on the etch stop layer and in contact with a first sidewall of the via portion; and
   a second etch stop pattern on the etch stop layer and in contact with a second sidewall of the via portion that is opposite to the first sidewall,
   wherein the second interlayer insulating layer extends on the first and second etch stop patterns and on a top surface of the etch stop layer that is free of the first and second etch stop patterns, and
   wherein the first and second etch stop patterns define a groove that is configured to guide the via portion to be connected to the lower interconnection line.

8. The semiconductor device of claim 7, wherein the etch stop layer includes a first surface treatment region having the first etch stop pattern thereon and a second surface treatment region having the second etch stop pattern thereon, and
wherein a first concentration of carbon in the first and second surface treatment regions is lower than a second concentration of carbon in another region of the etch stop layer different than the first and second surface treatment regions.

9. The semiconductor device of claim 8, wherein the first concentration of carbon ranges from about 1 at % to about 5 at %, and
wherein the second concentration of carbon ranges from about 10 at % to about 25 at %.

10. The semiconductor device of claim 8, wherein the first concentration of carbon increases with distance from the top surface of the etch stop layer toward the first interlayer insulating layer.

11. The semiconductor device of claim 7, wherein a maximum thickness of each of the first and second etch stop patterns is less than a thickness of the etch stop layer.

12. The semiconductor device of claim 7, wherein a third sidewall of the first etch stop pattern is in contact with the first sidewall of the via portion,
wherein a fourth sidewall of the second etch stop pattern is in contact with the second sidewall of the via portion,
wherein the third sidewall faces the fourth sidewall, and
wherein the groove is defined between the third sidewall and the fourth sidewall.

13. The semiconductor device of claim 7, wherein a distance between outer sidewalls of the first and second etch stop patterns ranges from about 1.2 times to about 3 times a width of the via portion in the groove.

14. The semiconductor device of claim 7, wherein a first dielectric constant of each of the first and second etch stop patterns is greater than a second dielectric constant of the etch stop layer.

15. A semiconductor device comprising:
a transistor on a substrate;
a first interlayer insulating layer on the transistor;
a lower interconnection line in an upper portion of the first interlayer insulating layer;
an etch stop layer on the first interlayer insulating layer and the lower interconnection line;
a second interlayer insulating layer on the etch stop layer;
an upper interconnection line in the second interlayer insulating layer, the upper interconnection line comprising a via portion penetrating the etch stop layer to contact the lower interconnection line;
a first etch stop pattern on the etch stop layer and in contact with a first sidewall of the via portion; and
a second etch stop pattern on the etch stop layer and in contact with a second sidewall of the via portion that is opposite to the first sidewall,
wherein the second interlayer insulating layer extends on the first and second etch stop patterns and on a top surface of the etch stop layer that is free of the first and second etch stop patterns, and
wherein a size of the first etch stop pattern is different from or asymmetric with respect to a size of the second etch stop pattern.

16. The semiconductor device of claim 15, wherein a maximum width of the first etch stop pattern is different from a maximum width of the second etch stop pattern.

17. The semiconductor device of claim 15, wherein the first etch stop pattern has a first height from the top surface of the etch stop layer,
wherein the second etch stop pattern has a second height from the top surface of the etch stop layer, and
wherein the first height is different from the second height.

18. The semiconductor device of claim 15, wherein the etch stop layer includes a first surface treatment region having the first etch stop pattern thereon and a second surface treatment region having the second etch stop pattern thereon, and
wherein a first concentration of carbon in the first and second surface treatment regions is lower than a second concentration of carbon in another region of the etch stop layer different than the first and second surface treatment regions.

19. The semiconductor device of claim 18, wherein the first concentration of carbon increases with distance from the top surface of the etch stop layer toward the first interlayer insulating layer.

20. The semiconductor device of claim 15, wherein a first dielectric constant of each of the first and second etch stop patterns is greater than a second dielectric constant of the etch stop layer.

\* \* \* \* \*